United States Patent
Mutchnik

(10) Patent No.: US 9,904,647 B2
(45) Date of Patent: Feb. 27, 2018

(54) DATA FLOW CIRCUITS FOR INTERVENTION IN DATA COMMUNICATION

(71) Applicant: SanDisk Technologies Inc., Plano, TX (US)

(72) Inventor: Sharon Mutchnik, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 451 days.

(21) Appl. No.: 14/506,094

(22) Filed: Oct. 3, 2014

(65) Prior Publication Data

US 2016/0098370 A1    Apr. 7, 2016

(51) Int. Cl.

| | |
|---|---|
| *G06F 9/00* | (2006.01) |
| *G06F 13/40* | (2006.01) |
| *G06F 9/445* | (2018.01) |
| *G06F 9/38* | (2018.01) |
| *G06F 11/00* | (2006.01) |
| *G11C 7/10* | (2006.01) |

(52) U.S. Cl.
CPC ........ *G06F 13/4068* (2013.01); *G06F 9/3869* (2013.01); *G06F 9/44505* (2013.01); *G06F 11/00* (2013.01); *G06F 13/4022* (2013.01); *G11C 7/1039* (2013.01)

(58) Field of Classification Search
CPC ............................. G06F 9/3869; G11C 7/1039
See application file for complete search history.

(56) References Cited

U.S. PATENT DOCUMENTS

| | | |
|---|---|---|
| 8,521,800 B1 | 8/2013 | Bergland et al. |
| 8,818,760 B2 | 8/2014 | Shannon et al. |
| 8,842,679 B2 | 9/2014 | Koponen et al. |
| 2004/0068640 A1 | 4/2004 | Jacobson et al. |
| 2007/0234004 A1 | 10/2007 | Oshima et al. |
| 2012/0286850 A1* | 11/2012 | Myers ................ G11C 14/0054 327/530 |

OTHER PUBLICATIONS

Kimberly DW et atl, "Input Multiplexer Card", IP.COM Journal, IP.COM INC., West Henrietta, NY, US, Jul. 1, 1983 (4 pages).
International Search Report and Written Opinion for corresponding application No. PCT/US2015/052155 dated Nov. 26, 2015 (12 pages).

* cited by examiner

*Primary Examiner* — Zachary K Huson
(74) *Attorney, Agent, or Firm* — Brinks Gilson & Lione

(57) ABSTRACT

A system may include date flow module circuits configured between electronic devices or circuits that may affect and/or intercept the flow of data being communicated between electronic devices. The data flow module circuits may communicate with an external controller that may want to intervene in the data communication. The data flow module circuits may be configured in a pass mode or in an intervention mode. In the pass mode, a data flow module circuit may pass on data it receives without intervention by the external controller. In the intervention mode, the data flow module circuit may receive instructions from the external controller as to the data that the external controller wants the data flow module to output.

31 Claims, 11 Drawing Sheets

DATA FLOW CIRCUITS FOR INTERVENTION IN DATA COMMUNICATION

BACKGROUND

Pipelining is a technique used in chip design that allows data propagation through sampling hardware stages and achieves high clock speeds. Pipelining may have various drawbacks. For example, if the pipeline has design bugs, the bugs may be difficult, costly, or even impossible to circumvent. In addition, the pipeline design may have accounted for an insufficient amount of time for logic propagation. Further, pipelines are often designed to perform a specific function or per specific specifications, and reusing the logic incorporated into a pipeline to perform a different function, even a slightly different one, may be impossible.

Firmware may be used instead of hardware pipelining to overcome the above-described deficiencies. However, using firmware may result in the development of large patches, which may be time and resource consuming, slow, and render useless the pipeline logic already configured in a given chip or digital block.

SUMMARY

In a first aspect, a system for intervention in data communication between electronic devices may include a gate module circuit configurable in a pass mode and in an intervention mode. The gate module circuit may be configured to receive data from a first device. When the gate module circuit is configured in the pass mode, the gate module circuit may be configured to output the data received from the first device without output of desired data in response to receipt of an instruction from an external controller to output the desired data. When the gate module circuit is configured in the intervention mode, the gate module circuit may be configured to receive the instruction from the external controller and output the desired data in response receipt of the instruction.

In a second aspect, a method of intervening in data communication between electronic devices may include receiving, with a gate module circuit, a mode value that configures the gate module circuit in one of a pass mode and an intervention mode; and receiving, with the gate module circuit, data from a first device. The method may further include outputting, with the gate module circuit, the data received from the first device to a second device without outputting desired data in response to receiving an instruction from an external controller to output the desired data when the gate module circuit is configured in the pass mode. In addition, the method may include receiving, with the gate module circuit, the instruction from the external controller to output the desired data; and outputting, with the gate module circuit, the desired data in response to receiving the instruction, when the gate module circuit is configured in the intervention mode:

In a third aspect, a system includes an external controller and a gate module circuit in communication with the external controller. The external controller may be configured to send a mode signal to the gate module circuit that configures the gate module circuit in one of a pass mode and an intervention mode. In response to the mode signal, the gate module circuit may be configured in the pass mode or in the intervention mode. When the gate module circuit is configured in the pass mode, the gate module circuit may be configured to output data received from a first device without output of a desired data in response to an instruction received from the external controller. When the gate module circuit is configured in the intervention mode, the gate module circuit may be configured to receive the instruction from the external controller to output the desired data and output the desired data to a second device in response to receipt of the instruction.

In sum, a system may include date flow module circuits configured between electronic devices or circuits to affect and/or intercept the flow of data being communicated in the event that an external controller determines to intervene in the data communication. The data flow module circuits may isolate the electronic devices into discrete stages, which may enable the external control module to analyze the individual functions performed by the electronic devices. Debugging a system may be easier since the devices are isolated. Interrupt signals may be communicated to the external controller when a specific function of an electronic device is finished being performed, enabling the external controller to read, analyze, and modify the data being communicated between the devices. The data flow module circuits may enable the devices in the system to operate at faster clock frequencies. Additionally, the data flow module circuits may be configured to operate with propagation delay settings that may be variable, which may account for different or varying propagation delays among different devices and/or which may introduce multi-cycle paths. The data flow control modules may eliminate the need to re-partitioned or redesign an existing system in the event of problems with the system or if it is desirable for one or more functions of the system to be used for applications other than for what the system was originally designed.

These and other embodiments, features, aspects and advantages of the present description will become better understood from the description herein, appended claims, and accompanying drawings.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Various modifications to and equivalents of the embodiments described and shown are possible and various generic principles defined herein may be applied to these and other embodiments. Thus, the claimed invention is to be accorded the widest scope consistent with the principles, features, and teachings disclosed herein.

The present disclosure describes data flow modules that are configured to affect the flow or communication of data being communicated between electronic devices or circuits. The data flow modules may be configured to communicate with and/or be controlled by an external controller that may intervene in the communication of the data to analyze, obtain, change, or otherwise use the data that is being communicated between the devices or circuits. The data flow modules may include a gate module that is configured to output data that it receives when the external controller does not intervene, or alternatively, output data as instructed by the external controller when the external controller intervenes. The data flow control modules may also include a combiner module that is configured to determine when a plurality of gate modules configured to output data to a downstream device are each outputting data to the downstream device as desired by the external controller.

Figure 1:
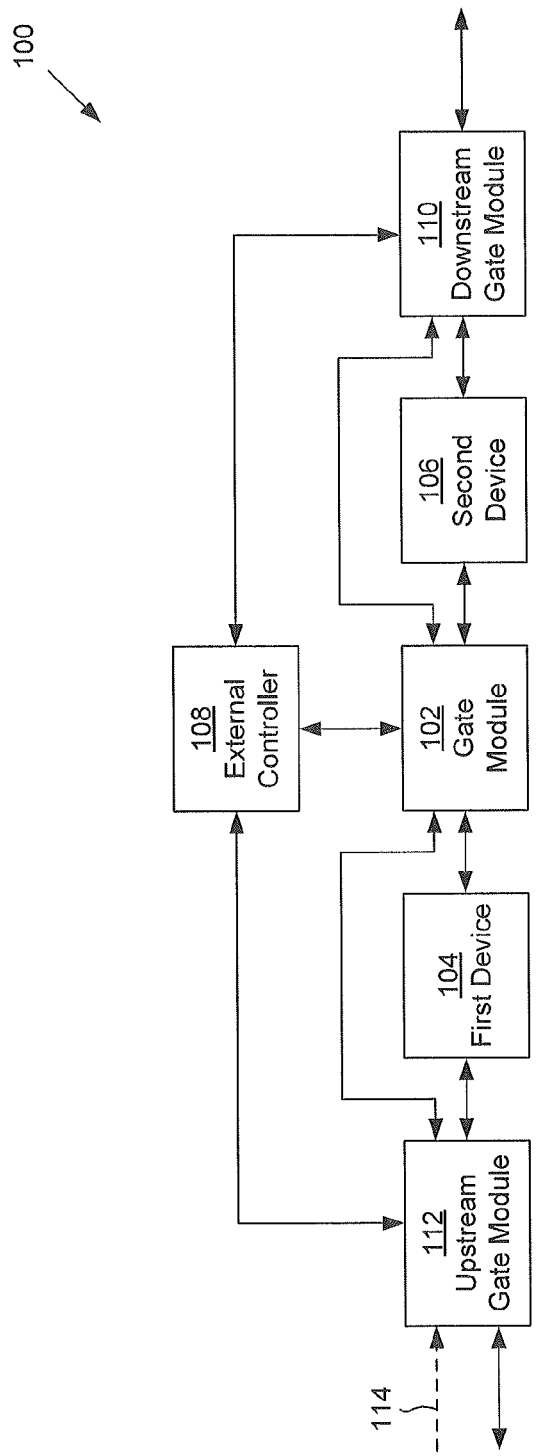
FIG. 1 is a block diagram of an example system that includes gate modules configured to communicate with electronic devices and an external controller.

FIG. 1 shows a block diagram of an example system 100 that includes a gate module 102 configured to communicate data with a first device 104 and a second device 106. The gate module 102 may be configured to output data to one of the first device 104 or the second device 106 in response to receipt of data from the other of the first device 104 or the second device 106. For example, the gate module 102 may be configured to receive data from the first device 104, and in response send data to the second device 106. Similarly, the gate module 102 may be configured to receive data from the second device 106, and in response send data to the first device 104. Hereafter, for simplicity, the first device 104 is described as being configured to send or output data to the gate module 102, and the second device 106 is described as being configured to receive data from the gate module 102.

The data that the gate module 102 outputs to the second device 106 may be the same as or different from the data that the gate module 102 receives from the first device 104. Whether the data is the same or different may depend on whether an external controller 108 intervenes in the communication of the data and/or what the external controller 108 instructs the gate module 102 to output upon intervention.

When the gate module 102 receives data from the first device 104, the gate module 102 may be configured to latch onto or otherwise retain the received data. For some example configurations, the gate module 102 may be configured to wait a predetermined time period before latching onto the data. When the predetermined time period expires, the gate module 102 may latch onto the data that it is receiving. The predetermined time period may be and/or correspond to a propagation delay experienced by the first device 104. In addition or alternatively, the predetermined time period may be quantified in terms of a number of clock cycles of a clock signal CLK, which may be input to the gate module 102 and the other components of the system 100 to control the timing of communication of data through the system 100. In addition or alternatively, the predetermined time period may be determined and/or set by the external controller 108. The external controller 108 may be configured to dynamically determine the predetermined time period. For example, at a first instance, the external controller 108 may set the time period to a first value, and at a second instance, the external controller 108 may change the time period to a second value.

The gate module 102 may also be configured to operate in one of two modes of operation—an intervention mode and a pass mode. In the intervention mode, the gate module 102 may affect the communication of data between the first device 104 and the second device 106 in that the gate module 102 may be configured to output data to the second device 106 as instructed to by the external controller 108. Upon receipt of data from the first device 104, the gate module 102 may be configured to notify the external controller 108 of the receipt of the data and/or provide the data to the external controller 108. In reply, the external controller 108 may send to the gate module 102 data that the external controller 108 wants the gate module 102 to output for downstream processing (or alternatively information that identifies the data that the external controller 108 wants the gate module 102 to output). Additionally, the external controller 108 may provide instructions that instruct the gate module 102 to latch onto and/or output the data that the external controller 108 is sending to the gate module 102 and/or an indication that indicates to the gate module 102 that the external controller 108 is finished intervening.

For some example configurations, the external controller 108 may communicate the data that the external controller 108 wants the gate module 102 to output for downstream processing, the instructions to latch onto and/or output the data, and the indication that the external controller 108 is finished intervening as separate signals and/or separate pieces of information to the gate module 102. For alternative example configurations, receipt of the data itself may be instruct the gate module 102 to latch onto and/or output the data as well as serve as an indication that the external controller 108 is finished intervening. For other alternative configurations, external controller 108 may communicate the data along with instructions to latch onto and/or output the data, where the instructions also indicate that the external controller 108 is finished intervening. Alternatively, the external controller 108 may communicate the data along with the indication that the external controller 108 is finished intervening, which may also instruct the gate module 102 to latch onto and/or output the data. Various configurations or combination of configurations for communicating the data that the external controller 108 wants the gate module 102 to output for downstream processing, the instructions to latch onto and/or output the data, and the indication that the external controller 108 is finished intervening may be possible.

Alternatively, when the gate module 102 is configured in the pass mode, the external controller 108 may not intervene in the communication of data between the first device 104 and the second device 106. Accordingly, when the gate module 102 is in the pass mode, the gate module 102 may be configured to pass or output the data received from the first device 104 to the second device 106 without notifying and/or providing the received data to the external controller 108, and/or without receiving from the external controller 108 data that the external controller 108 wants to the gate module 102 to output. As such, when the gate module 102 is in the pass mode, the data that gate module 102 receives from the first device 104 may be the same as the data the gate module outputs to the second device 106.

The external controller 108 may be configured to set the gate module 102 in the pass mode or in the intervention mode. The external controller 108 may set the gate module 102 in the intervention mode when the external controller 108 wants to know, change, and/or otherwise use the data that the gate module 102 is receiving. In turn, when the gate module 102 receives data from the first device 104, the gate module 102, in the intervention mode, may notify the external controller 108 and/or provide the data to the external controller 108. Alternatively, when the external controller 108 does not want to know, change, and/or otherwise use the data received by the gate module 102, then the external controller 108 may set the gate module 102 in the pass mode. In the pass mode, the gate module 102 may not notify the external controller 108 of the received data and/or provide the received data to the external controller 108.

The external controller 108 may want to know, change, and/or otherwise use the output that the gate module 102 is receiving for various reasons and/or in various settings or environments. As an illustration, suppose it is known that the first device 104 is defective and is outputting defective data. Without intervention by the external controller 108, the defective data may be output from the first device 104 to the second device 106 via the gate module 102, and in turn, the second device 106 may undesirably use the defective data for subsequent processing. Rather than have the defective data sent to and used by the second device 106, the external controller 108 may set the gate module 102 in the intervention mode and provide the gate module 102 with the correct data. The correct data may then be output by the gate module 102 to the second device 106.

As another example illustration, suppose it is unknown whether or not the first device 104 is defective. The external controller 108 may set the gate module 102 in the intervention mode to see whether or not the data being output from the first device 104 to the gate module 102 is correct. If not, the external controller 108 may provide the gate module 102 with the correct data for output to the second device 106. If so, then the external controller 108 may instruct the gate module 102 to output the data that it received from the first device 104 to the second device 106.

As a further example illustration, suppose the function or operation that the first device 104 is configured to perform has become obsolete or has changed. For example, suppose the first device 104 is an adder configured to add two values A and B, and suppose the second device 106 is configured to perform some operation on the output of the first device 104. Further, suppose that for some change in circumstances, the second device 106 is to operate on the difference between the values A and B instead of their sum. Rather than replace the first device 104, as an adder, with a subtracting device, the external controller 108 may configure the gate module 102 in the intervention mode and then provide the gate module 102 with the difference between the values A and B for output to the second device 106.

As another example illustration, suppose the first device 104 performs some function and/or outputs some value that is desired by the external controller 108, such as for some use other than the function being performed by the second device 106. The external controller 108 may configure the gate module 102 in the intervention mode to receive the output of the first device 104.

In addition to outputting data to the second device 106, the gate module 102 may also be configured to output a done signal to another gate module 110 that is configured downstream from the gate module 102 (i.e., in the direction in which the gate module 102 outputs data). The gate module 102 may be configured to output the done signal when the external controller 108 is finished intervening and when the gate module 102 has latched onto and/or is outputting data that the external controller 108 desires the gate module 102 to output for downstream processing.

The gate module 102 may be configured to output the done signal in either the intervention mode or in the pass mode. In the intervention mode, the gate module 102 may be configured to output the done signal when the gate module 102 is outputting the data as expressly instructed to by the external controller 108 and/or when the external controller 108 has expressly indicated to the gate module 102 that the external controller 108 is finished intervening. In this way, the done signal output by the gate module 102 when configured in the intervention mode may be an express indication that the external controller 108 is finished intervening and/or that the gate module 102 is outputting data that external controller 108 desires the gate module 102 to output for downstream processing.

In the pass mode, the gate module 102 may be configured to output the done signal when the gate module 102 latches onto and/or outputs the data received from the first device 104. Because the external controller 108 may set the gate module 102 in either the pass mode or in the intervention mode, the gate module 102 being set in the pass mode may imply that the external controller 108 wants the gate module 102 to output the data that it receives from the first device 104 upon expiration of the predetermined time period. Accordingly, the done signal output by the gate module 102 when configured in the pass mode may be an implied indication that the external controller 108 is finished intervening and/or that the gate module 102 is outputting data that the external controller desires the gate module 102 to output for downstream processing.

For some example configurations, the gate module 102 may be configured to automatically output the data that it latches onto to the second device 106. Accordingly, when the gate module 102 determines that the predetermined time period has expired, the gate module 102 may be configured to latch onto the data received from the first device 104 as well as output the data that it latches on to. However, when the gate module 102 is configured in the intervention mode, the data that the gate module 102 receives from the first device 104 may not be the data that the external controller 108 wants the gate module 102 to output. As such, a period of time may elapse from the time that the predetermined time period expires to the time that the gate module 102 is outputting data that the external controller 108 wants it to. During this time period, the second device 106 may receive and/or process data that the external controller 108 does not want the second device 106 to receive and/or process. In turn, the second device 106 may generate an output based on the unwanted data and send the output to the downstream gate module 110.

To prevent the downstream gate module 110 from latching onto output data received from the second device 106 that is generated based on unwanted input data, the downstream gate module 110 may ignore, drop, or otherwise not retain the data that it is receiving from the second device 106 until it receives the done signal from the gate module 102. When the gate module 102 is outputting data that the external controller 108 wants the gate module 102 to output, the gate module 102 may send the done signal to the downstream gate module 110. The done signal may indicate to the downstream gate module 110 to latch onto the data that it is receiving and/or when to latch onto the data. Accordingly, when the downstream gate module 110 receives the done signal from the gate module 102 and latches onto output data received from the second device 106, the output data that it latches onto may be generated based on data output from the gate module 102 as desired by the external controller 108.

As an example illustration, suppose the first device 104 outputs a value A, and in response to receipt of the value A, the second device 106 outputs a value B. When the gate module 102 is configured in the intervention mode but has not yet received instructions from the external controller 108 that it is finished intervening, the gate module 102 may output the received value A to the second device 106, which in turn may output the value B to the downstream gate module 110. Because the gate module 102 has not yet received instructions from the external controller 108, the gate module 102 may output the value A to the second device 106 without outputting a done signal to the downstream gate module 110. Accordingly, when the downstream gate module 110 receives the value B from the second device 106, the downstream gate module 110 may not latch onto the value B because it did not receive the done signal. Further, suppose that upon intervention, the external controller 108 instructs the gate module 102 to output a desired value C to the second device 106, which in turn outputs a value D based on the received value C to the downstream gate module 110. Upon being instructed to output the value C, the gate module 102 may output the done signal along with the value C so that the downstream gate module 110 latches onto the value D that it receives from the second device 106.

In addition to outputting data and a done signal, the gate module 102 may also be configured to output an interrupt signal to the external controller 108 when the gate module 102 latches onto received data. For some example configurations, the gate module 102 may be configured to output the interrupt signal when configured in the intervention mode, but not in the pass mode. The interrupt signal may notify the external controller 108 that the gate module 102 has latched onto the data received from the first device 104. Upon receipt of the interrupt signal, the external controller 108 may know to begin analyzing the data being retained by the gate module 102. For some example configurations, the gate module 102 may be configured to wait a predetermined time period before sending the interrupt signal to the external controller 108. The predetermined time period may be the same amount of time that the gate module 102 waits before latching onto data received from the first device 104. When the predetermined time period expires, the gate module 102 may latch onto the data it receives from the first device 104 and send the interrupt signal to the external controller 108.

The gate module 102 may be configured to begin waiting for the predetermined time period upon receipt and/or detection of a start signal. Upon receipt of the start signal, the gate module 102 may begin waiting the predetermined time period. For some example configurations, the start signal may be received from another gate module 112 that is upstream to the gate module 102. Alternatively, the start signal may be received from a device in the system 100 other than the upstream gate module 112, such as the first device 104 or the external controller 108. Still alternatively, the start signal may be received as an external input to the system 100.

When the gate module 102 receives a start signal from the upstream gate module 112, the start signal may be the done signal output by the upstream gate module 112. In a similar way, the done signal output by the gate module 102 may be the start signal received by the downstream module 110. For some example configurations, for a given flow of data through the system 100, the start signal received by a gate module may be the done signal output by a respective upstream gate module, except for an initial gate module in the flow, which may receive a start signal as an external input to the system 100 or from a device other than a gate module of the system 100. FIG. 1 shows the upstream gate module 112 received a start signal as an external input to the system 100, as denoted by dotted arrow 114.

The upstream gate module 112 and the downstream gate module 110 may be configured to function and/or operate in a similar way as the gate module 102. For example, the upstream and downstream gate modules 112, 110 may each be configured to operate in a pass mode and an intervention mode, receive data from one device and output data to another device, communicate with and/or be controlled by the external controller 108, latch onto data, wait predetermined periods of time, output done signals and interrupt signals, and receive start signals, as previously described for the gate module 102. In addition, the operations and/or functions performed by the gate modules 102, 110, 112 may be performed independent of each other.

In addition or alternatively, the external controller 108 may be configured to independently control and/or communicate with each of the gate modules 102, 110, 112. As an example, the external controller 108 may set each of the gate modules 102, 110, 112 in either the pass mode or the intervention mode independent of each other. The external controller 108 may be configured to communicate with each of the gate modules 102, 110, 112 using various addressing and bus techniques. For example, each of the gate modules 102, 110, 112 may be addressable entities in the system 100 that have one or more addresses, which may be mapped to a memory space of the external controller 108.

In addition or alternatively, the predetermined time periods that each of the gate modules 102, 110, 112 may be configured to wait may be the same as or different from each other. For some example configurations, respective predetermined time periods for the gate module 102, 110, 112 may depend on respective propagation delays of devices from which the gate modules 102, 110, 112 receive data. For example, if the first device 104 has a longer propagation delay than the second device 106, then the gate module 102 may be configured to wait a proportionately longer predetermined time period than the downstream gate module 110.

Although the system 100 shown in FIG. 1 includes only three gate module 102, 110, 112 and two devices 104, 106, alternative configurations of the system 100 may include any number of gate modules and electronic devices. For example, in addition to the second device 106, the downstream gate module 110 may be configured to communicate with a third device. The downstream gate module 110 may be configured to receive data from the second device 106 and output the received data or data as instructed by the external controller 108 to the third device, depending on whether the downstream gate module 110 is configured in the pass mode or in the intervention mode. In addition, the downstream gate module 110 may output a done signal to a gate module that is downstream from it and that receives data from the third device. Similarly, in addition to being configured to communicate with the first device 104, the upstream module 112 may be configured to communicate with a fourth device. For example, the upstream gate module 112 may be configured to receive data from the fourth device and send data to the first device 104. In addition, the upstream gate module 112 may be configured to receive a start signal from a gate module that is upstream to it. Various configurations of the number of gate modules configured with devices for the system 100 may be possible.

Figure 2:
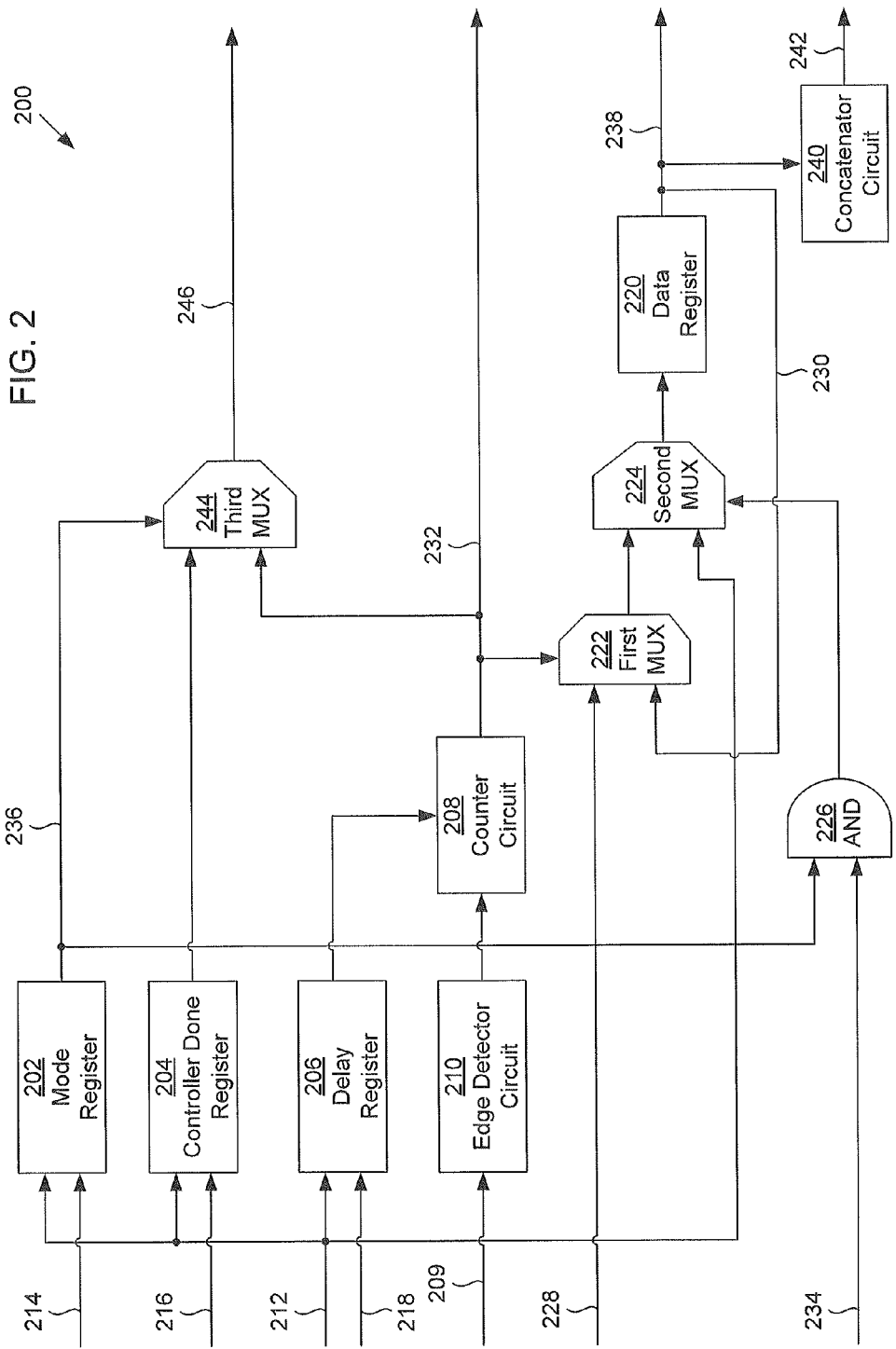
FIG. 2 is block diagram of an example hardware circuit of a gate module.

A gate module may be implemented in hardware, which may be, at least in part, register based and/or flip-flop based. FIG. 2 shows block diagram of an example hardware circuit 200 of a gate module, which may the hardware implementation for each of the gates modules 102, 110, 112 shown in FIG. 1.

The gate module circuit 200 may include a mode register 202, a controller done register 204, and a delay register 206. The mode register 202 may be configured to receive, latch onto, and/or output a mode value that configures the gate module circuit 200 in either the pass mode or the intervention mode. The controller done register 204 may be configured to receive, latch onto, and/or output a controller done value that indicates whether or not the external controller 108 (FIG. 1) is finished intervening. The delay register 206 may be configured to receive, latch onto, and/or output a delay value that indicates the predetermined time period.

The gate module circuit 200 may further include a counter circuit 208 that may be configured to receive the delay value output from the delay register. Based on the delay value, the counter circuit 208 may be configured to determine the duration of the predetermined time period and when the predetermined time period expires. Additionally, the counter circuit 208 may be configured to begin the predetermined time period upon detection of a start signal received by the gate module circuit 200 at start signal input 209. For some example configurations, the start signal may be a pulsed signal in which a transition of the pulse may be detected by an edge detector circuit 210, such as a rising edge detector circuit, that may be integrated with and/or configured to provide an output to the counter circuit 208. Upon detection of the pulse of the start signal, the edge detector circuit 210 may send an output to the counter circuit 208 to begin the predetermined time period. Based on the delay value received from the delay register 206, the counter circuit 208 may then determine when the predetermined time period expires.

The gate module circuit 200 may communicate data and instructions with the external controller 108 via a plurality of communication lines or connections. One of the communication lines may include a controller data input line 212 that may communicate data from the external controller 108 to the gate module circuit 200. The data may include desired data that the external controller wants the gate module circuit 200 to output to a downstream device. In addition, the data may include the mode value, the controller done value, and the delay value. For some example configurations, the controller data input line 212 may be a multi-bit (e.g., 32-bit) bus and/or include a plurality of lines to communicate the different types of data. As shown in FIG. 2, the controller data input line 212 may be connected to each of the mode, controller, and delay registers 202, 204, 206 so that each of the registers 202, 204, 206 may receive their respective mode, controller done, and delay values from the external controller 108.

The plurality of communication lines may also include a plurality of strobe lines to control when each of the registers 202, 204, 206 writes or latches onto their respective values. The strobe lines may include a mode strobe line 214 connected to the mode register 202 that is configured to communicate a mode strobe signal from the external controller 108 to the mode register 202. The mode strobe signal may indicate and/or instruct the mode register 202 to write and/or latch onto the mode value being received from the controller data input line 212. The strobe lines may also include a controller done strobe line 216 connected to the controller done register 204 that may be configured to communicate a controller done strobe signal from the external controller 108 to the controller done register 204. The controller stroller strobe signal may indicate and/or instruct the controller done register 204 to write and/or latch onto the controller done value being received from the controller data input line 212. The strobe lines may further includes a delay strobe line 218 connected to the delay register 206 that is configured to communicate a delay strobe signal from the external controller 108 to the delay register 206. The delay strobe signal may indicate and/or instruct the delay register 206 to write and/or latch onto the delay value being received from the controller data input line 212.

The gate module circuit 200 may also include a data register 220 that is configured to receive, latch onto, and/or output data that the gate module circuit 200 receives from an upstream device (e.g., the first device 104 or the second device 106 in FIG. 1) or controller data provided from the external controller 108. When the gate module circuit 200 is in the intervention mode and the gate module circuit 200 receives instructions from the external controller 108 to latch onto data that the external controller 108 is providing it, then the data register 220 may be configured to receive, latch onto, and/or output the data being received from the external controller 108. Alternatively, if the gate module circuit 200 is either not in the intervention mode or has not received instructions to latch onto data received from the external controller 108, and if the predetermined time period determined by the counter circuit 208 has expired, then the gate module circuit 200 may be configured to receive, latch onto, and/or output the data being received from the upstream device. Still alternatively, if the gate module circuit 200 is either not in the intervention mode or has not received instructions to latch onto data from the external controller 108, and if the predetermined time period has not yet expired, then the data register 220 may be configured to retain the data that it is currently storing and outputting.

The gate module circuit 200 may further include selection circuitry that is configured to select and/or determine whether the data register 220 receives, latches onto, and/or outputs data received from the upstream device or data received from the external controller 108 in accordance with the above. That is, the selection circuitry may be configured to detect whether the gate module circuit 200 is in the intervention mode, whether the gate module circuit 200 has received instructions from the external controller 108 to latch onto the controller data, and whether the predetermined time period has expired. If gate module circuit 200 is in the intervention mode and the gate module circuit 200 has received instructions from the external controller 108 to latch onto the controller data, then the selection circuitry may send data received from the upstream device to the data register 220. Alternatively, if the gate module circuit 200 is either not in the intervention mode or has not received instructions to latch onto the controller data, and the selection circuitry detects that the predetermined time period has expired, then the selection circuitry may be configured to output data received from the upstream device to the data register 220. Still alternatively, if the gate module circuit 200 is either not in the intervention mode or has not received instructions to latch onto the controller data, and if the selection circuitry detects that the predetermined time period has not yet expired, then the data register 220 may be configured to output data the data that is being retained and output by the data register 220 back to the data register 220.

In an example implementation of the selection circuitry shown in FIG. 2, the selection circuitry may include a first multiplexer (MUX) 222, a second multiplexer 224, and an AND logic circuit (AND) 226. The first multiplexer 222 may be configured to receive, at a first input, data from the upstream device via an upstream data input line 228. In addition, the first multiplexer 222 may be configured to receive, at a second input, data being output from the data register 220 via a feedback line 230. The counter circuit 208 may be configured to output an expiration signal upon expiration of the predetermined time period via an expiration output line 232. The first multiplexer 222 may be configured to receive, at a third input, the expiration signal being output from the counter circuit 208. When the predetermined time period expires, the expiration signal received at the third input may cause the first multiplexer 222 to output the data received at the first input from the upstream device via the upstream data input line 228. Alternatively, when the predetermined time period has not yet expired or after predetermined time period expires but the expiration signal is no longer being received, the first multiplexer 222 may be configured to output the output of the data register 220 being received at the second input via the feedback line 230.

A first input of the second multiplexer 224 may be configured to receive the output of the first multiplexer 222. In addition, a second input of the second multiplexer 224 may be configured to receive the controller data from the controller data input line 212. The instructions to latch onto the controller data may be in the form of a latch controller data strobe signal that is communicated from the external controller 108 via a latch controller data strobe line 234. The AND logic circuit 226 may be configured to receive, at a first input, the latch controller data strobe signal via the latch controller data strobe line 234, and, at a second input, the mode value being output from the mode register 202 via a mode output line 236. When the mode value indicates that the gate module circuit 200 is in the intervention mode and the latch controller data strobe signal indicates to latch onto the controller data—such as by both being at logic "1" values, the AND logic circuit 226 may be configured send the latch controller data strobe signal as a third input to the second multiplexer 224. Upon receipt of the controller data strobe signal at the third input, the second multiplexer 224 may be configured to output the controller data being received at the second input. Alternatively, if the latch controller data strobe signal does not indicate to latch onto the controller data or the gate module circuit 200 is not in the intervention mode, then the output of the AND logic circuit 226 may cause the second multiplexer 224 to output the output of the first multiplexer 222 being received at the first input.

The data output by the data register 220 may be configured to output to a downstream device (e.g., the first device 104 or the second device 106 shown in FIG. 1) via a data output connection 238. The data output by the data register 220 may also be output to the external controller 108. For some example configurations, the data being output by the data register 220 may be a multi-bit signal that has a number of bits that is unequal to the number of bits for data that the external controller 108 and the gate module circuit 200 communicate with each other. For these example configurations, the gate module circuit 200 may further include a concatenator circuit 240 that may be configured to receive the data output by the data register 220 and adjust the data, such as by appending a certain number of zeros to the data, to generate a controller data output signal. To illustrate, if the data output by the data register 220 is a N-bit data signal and the gate module circuit 200 communicates M-bit data signals with the external controller 108 (where M is greater than N), then the concatenator circuit 240 may be configured to append a "M minus N" number of zeros to the data output by the data register 220 to generate a controller data output signal. The concatenator circuit 240 may be configured to output the controller data output signal to the external controller 108 via a controller data output line 242.

As previously described with reference to FIG. 1, a gate module may be configured to output an interrupt signal to the external controller 108 that notifies the external controller 108 that the gate module has latched onto data received from an upstream device. For the example gate module circuit 200 shown in FIG. 2, the expiration signal output by the counter circuit 208 may be the interrupt signal. When the predetermined time period expires, the counter circuit 208 may output the expiration signal to the first multiplexer 222 and to the external controller 108 as the interrupt signal via the expiration output line 232. The expiration signal may be used as the interrupt signal because the data register 220 will have latched onto the data received from the upstream device upon expiration of the predetermined time period. That is, prior to the external controller 108 being notified with the interrupt signal, upon expiration of the predetermined time period, the first and second multiplexers 222 and 224 will have passed the data received from the upstream device to the data register 220 because the external controller 108 will not yet have provided instructions to latch onto the controller data via the latch controller data strobe line 234.

The gate module circuit 200 may further include a third multiplexer 244 that is configured to output the done signal via a done signal output line 246. The third multiplexer 244 may be configured to receive at a first input the expiration signal output from the counter circuit 208. In addition, the third multiplexer 244 may be configured to receive at a second input the controller done value output from the controller done register 204. The third multiplexer 244 may further be configured to receive at a third input the mode value output from the mode register 202. When the mode value indicates that the gate module circuit 200 is in the pass mode, the third multiplexer 244 may be configured to output the expiration signal as the done signal. The third multiplexer 244 may output the expiration signal as the done signal because when the gate module circuit 200 is in the pass mode, the first and second multiplexers 222, 224 will output the data received from the upstream device to the data register 220 upon expiration of the predetermined time period. Alternatively, when the mode value indicates that the gate module circuit 200 is in the intervention mode, the third multiplexer 244 may be configured to output the controller done value as the done signal. The external controller 108 may be configured to output the controller done value to indicate that the external controller 108 is finished intervening when the external controller 108 has set the gate module circuit 200 in the intervention mode and when the external controller 108 has instructed the gate module circuit 200 to latch onto the controller data using the latch controller data strobe signal communicated via the latch controller data strobe line 234. Accordingly, when the controller done register 204 outputs to the third multiplexer 244 the controller done value indicating that the external controller 108 is done intervening, the data register 220 will have latched onto the controller data received from the second register 224.

Although not shown in FIG. 2, one or more of the components of the gate module circuit 200 may be configured to receive a clock signal and/or a reset signal to latch onto data, be configured in a known state, or otherwise perform its functions.

Figure 3:
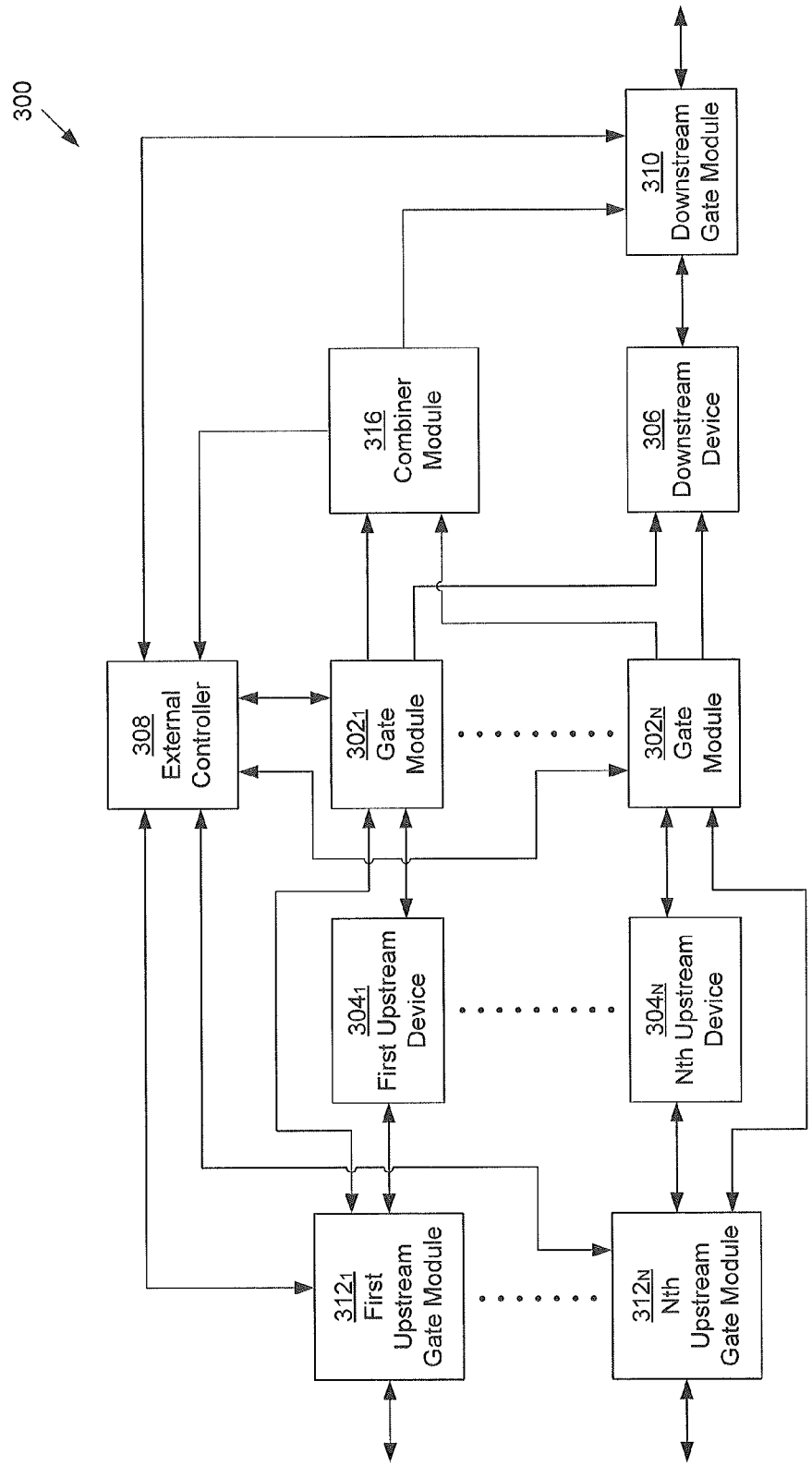
FIG. 3 is a block diagram of another example system that includes gate modules and a combiner module configured to communicate with electronic devices and an external controller.

FIG. 3 shows another example system 300 that includes a plurality or a N-number of gate modules $302_1$ to $302_N$, each configured to receive data from a respective upstream device $304_1$ to $304_N$ and output data to a downstream device 306. The downstream device 306 may be a device that is configured to generate an output based on multiple inputs. As an example, the downstream device 306 may be an adder that receives and adds input values A and B to generate an output value C.

Each of the gate modules $302_1$ to $302_N$ may be configured to operate in the same way as the gate module 102 and be implemented in accordance with the gate module circuit 200, as previously described with reference to FIGS. 1 and 2. Additionally, each of the gate modules $302_1$ to $302_N$ may be configured to communicate with and/or be controlled by an external controller 308 in the same or similar way that the gate module 102 and gate module circuit 200 communicate with the external controller 108. Accordingly, the data that each of the gate modules $302_1$ to $302_N$ output to the downstream device 306 may be the same as or different from the data that each receives from its respective upstream device $304_1$ to $304_N$, depending on whether the gate modules $302_1$ to $302_N$ are in the pass mode or in the intervention mode and/or depending on the data that the external controller 308 instructs each of the gate modules $302_1$ to $302_N$ to output.

In the system 300, two or more of the gate modules $302_1$ to $302_N$ may be configured to output data as desired by the external controller 308 at different times. Otherwise stated, one or more of the gate modules $302_1$ to $302_N$ may output data as desired by the external controller 308 for downstream processing before the external controller 308 is finished intervening in the communication of data for all of the gate module $302_1$ to $302_N$. The desired data may be output at different times for one or more of various reasons. One reason may be that some of the gate modules $302_1$ to $302_N$ may be configured in the pass mode while others may be configured in the intervention mode. Assuming the gate modules $302_1$ to $302_N$ receive data from respective upstream devices $304_1$ to $304_N$ at the same time, those gate modules $302_1$ to $302_N$ configured in the pass mode may be configured to output data desired for downstream processing earlier than those gate modules $302_1$ to $302_N$ configured in the intervention mode.

Another reason may be that the external controller 308 takes different amounts of time to intervene in the communication of data for different gate modules $302_1$ to $302_N$. For example, if two of the gate modules $302_1$ to $302_N$ are in the intervention mode, the external controller 308 may take longer to process data received from one of the gate modules $302_1$ to $302_N$ compared to the other. In addition or alternatively, the external controller 308 may take longer to provide data to one of the gate modules $302_1$ to $302_N$.

An additional reason may be that two or more of the gate modules $302_1$ to $302_N$ may determine expirations of respective predetermined time periods at different times. For example, two or more of the gate modules $302_1$ to $302_N$ may be set with different predetermined time periods. In addition or alternatively, two or more of the gate modules $302_1$ to $302_N$ may receive start signals, such as from respective upstream gate modules $312_1$ to $312_N$ at different times. Two or more of the gate modules $302_1$ to $302_N$ that determine expirations of respective predetermined time periods at different times may latch onto data received from respective upstream devices $304_1$ to $304_N$ and/or provide the received data to the external controller 308 at different times.

Due to all or at least some of these reasons, two or more of the gate modules $302_1$ to $302_N$ may output data that the external controller 308 wants the gate modules $302_1$ to $302_N$ to output for downstream processing at different times. Accordingly, the downstream device 306 may receive data that the external controller 308 wants the downstream device 306 to use to generate its output at different times. As such, prior to when the external controller 308 is finished intervening in the communication of all of the data to the downstream device 306 and/or prior to when all of the gate module $302_1$ to $302_N$ are sending data to the downstream device 306 as desired by the external controller 308, the downstream device 306 may send output data to a downstream gate module 310 that is based, at least in part, on input data that the external controller 308 does not want the downstream device 306 to receive.

The system 300 may further include a combiner module 316 that is configured to detect when the external controller 308 is finished intervening and all of the gate modules $302_1$ to $302_N$ are outputting data to the downstream device 306 as desired by the external controller 308. Upon the detection, the combiner module 316 may be configured to output a done signal to the downstream gate module 310, which may indicate to the downstream gate module 310 to latch onto the data it is receiving from the downstream device 306 and/or when to latch onto the data it is receiving. In this way, the downstream gate module 310 may latch onto output data that the downstream device 306 generated based on input data, all of which the external controller 308 wanted the downstream device 306 to receive.

Like the gate module 102, each of the gate modules $302_1$ to $302_N$ may be configured to output a done signal when each is outputting data as desired by the external controller 308 and/or when each receives an indication from the external controller 308 that the external controller 308 is finished intervening. For the system 300, each of the gate modules $302_1$ to $302_N$ may be configured to output respective done signals to the combiner module 316. When the combiner module 316 receives done signals from each of the gate modules $302_1$ to $302_N$, the combiner module 316 may detect that the external controller 308 is finished intervening in the communication of all of the data being communicated with the gate module $302_1$ to $302_N$ and all of the gate modules $302_1$ to $302_N$ are outputting data to the downstream device 306 as desired by the external controller 308. Accordingly, when the combiner module 316 receives done signals from all of the gate module $302_1$ to $302_N$, the combiner module 316 may, in turn, output a done signal to the downstream gate module 310.

In addition, the combiner module 316 may be configured to communicate to the external controller 308 which of the gate modules $302_1$ to $302_N$ have output done signals and/or when all of the gate modules $302_1$ to $302_N$ have output a done signal. For some example configurations, the communication may be in the form of a multi-bit signal that includes bits corresponding to the gate modules $302_1$ to $302_N$, where each of the bits indicates whether or not the combiner module 316 has received a done signal from the corresponding one of the gate modules $302_1$ to $302_N$.

For some example configurations, the combiner module 316 may also be configured to detect when each of the gate modules $302_1$ to $302_N$ has latched onto data received from respective upstream devices $304_1$ to $304_N$. Like the gate module 102 of FIG. 1, each of the gate modules $302_1$ to $302_N$ (or, for some example configurations, those gate modules $302_1$ to $302_N$ configured in the intervention mode) may be configured to output an interrupt signal indicating that the gate modules $302_1$ to $302_N$ have latched onto and/or are outputting data received from a respective upstream device $304_1$ to $304_N$ when a respective predetermined time period expires. In addition or in the alternative to outputting a respective interrupt signal to the external controller 308, each of the gate modules $302_1$ to $302_N$ may send a respective interrupt signal to the combiner module 316. When the combiner module 316 receives an interrupt signal from all of the gate modules $302_1$ to $302_N$, the combiner module 316 may, in turn, be configured to output an interrupt signal to the external controller 308. The interrupt signal received from the combiner module 316 may notify and/or indicate to the external controller 308 that all of the gate modules (or for some example configurations, all of the those gate modules $302_1$ to $302_N$ configured in the intervention mode) have latched onto and/or are outputting data received from the respective upstream devices $304_1$ to $304_N$. For some example configurations, the interrupt signal communicated from the combiner module 316 to the external controller 308 may be in the form of a multi-bit signal that includes bits corresponding to the gate modules $302_1$ to $302_N$, where each of the bits indicates whether or not the combiner module 316 has received an interrupt signal from the corresponding one of the gate modules $302_1$ to $302_N$.

Figure 4:
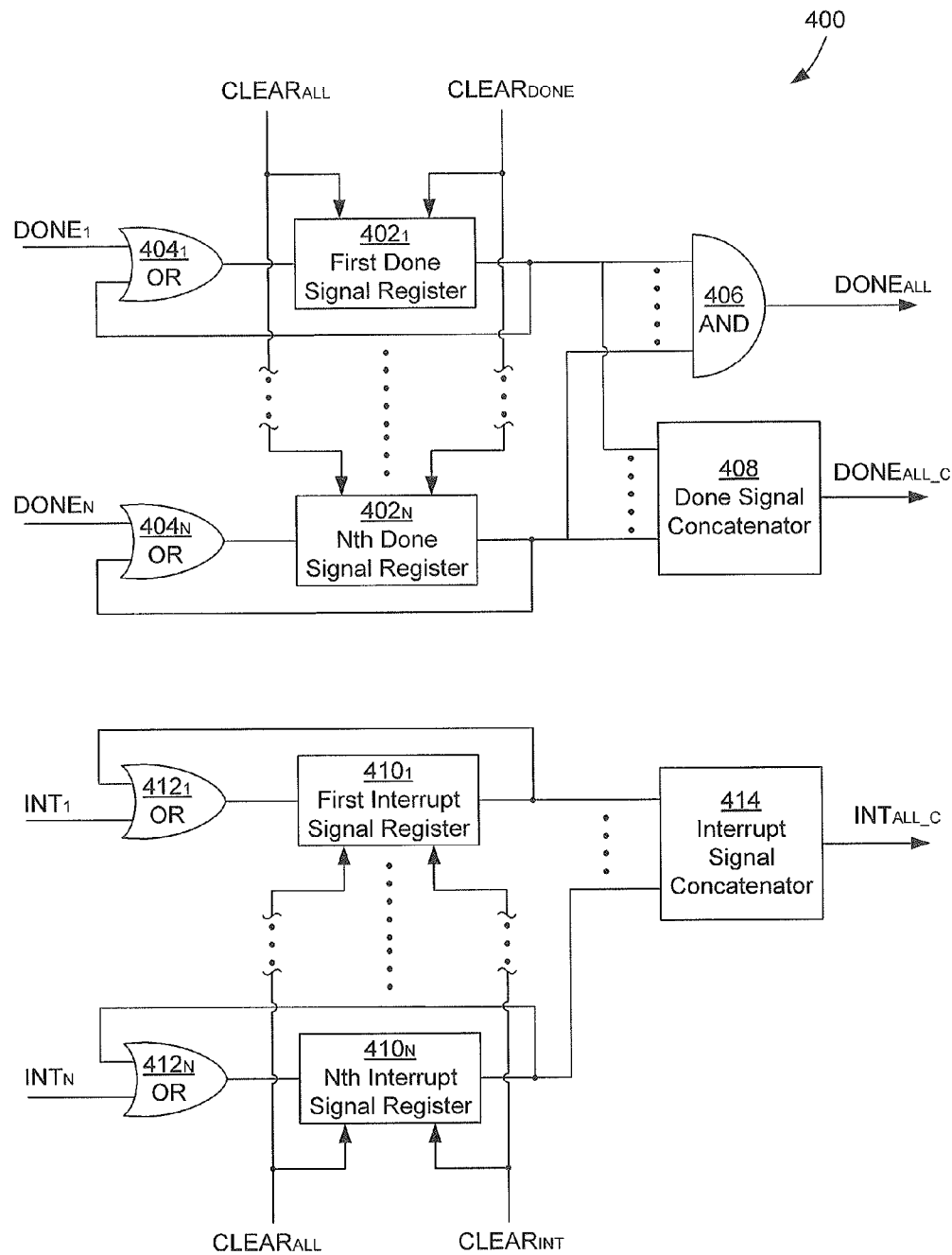
FIG. 4 is a block diagram of an example hardware circuit of a combiner module.

The combiner module 316 may be implemented in hardware, which may be, at least in part, register based and/or flip-flop based. FIG. 4 shows a block diagram of an example hardware circuit 400 of the combiner module 316. The example combiner module circuit 400 may include an N-number of done signal registers $402_1$ to $402_N$ and a N-number of first OR gate logic circuits $404_1$ to $404_N$. Each of the done signal registers $402_1$ to $402_N$ may be configured to store or retain a value that indicates whether a done signal has been received from a corresponding one of the gate modules $302_1$ to $302_N$.

Each of the done signal registers $402_1$ to $402_N$ may have an input that is coupled to an output of one of the first OR gate logic circuits $404_1$ to $404_N$. Each of the done signal registers $402_1$ to $402_N$ may be configured to receive, retain, and output the output received from a respective one of the first OR gate logic circuits $404_1$ to $404_N$.

Each of the first OR gate logic circuits $404_1$ to $404_N$ may have a first input that is configured to receive one of a N-number of done signals—denoted as $DONE_1$ to $DONE_N$ in FIG. 4—from a respective one of the N-number of gate modules $302_1$ to $302_N$ shown in FIG. 3. Each of the first OR gate logic circuits $404_1$ to $404_N$ may also have a second input that is coupled to an output of a corresponding one of the done signal registers $402_1$ to $402_N$.

Each of the first OR gate circuits $404_1$ to $404_N$ may be configured to generate an output signal by performing an OR logic operation on a done signal received at a first input and an output of a corresponding one of the done signal registers $402_1$ to $402_N$ received at a second input. A done signal may be received at the first input when an input signal received at the first input transitions from a logic "low" level (i.e., a level corresponding to a logic "0") to a logic "high" level (i.e., a level corresponding to a logic "1"). Before a done signal is received, each of the first OR gate logic circuits $404_1$ to $404_N$ may be configured to output an output signal having a logic "low" level indicating that the done signal has not been received. In turn, the corresponding done signal registers $402_1$ to $402_N$ may retain a logic "low" value and output an output signal with a corresponding logic "low" level indicating that the done signal has not been received. The logic "low" output signal may be fed back to the second input of the corresponding one of the first OR gate logic circuits $404_1$ to $404_N$. In this way, before receipt of a done signal, each of the done signal registers $402_1$ to $402_N$ may continually retain and output a value indicating that a done signal has not been received.

Upon receipt of a done signal, each of the first OR gate logic circuits $404_1$ to $404_N$ may output the output signal at a logic "high" level indicating that the done signal has been received. In turn, the corresponding done signal registers $402_1$ to $402_N$ may retain a logic "high" value and output an output signal corresponding to the logic "high" level indicating that the done signal has been received. The logic "high" output signal may be fed back to the second input of the corresponding one of the first OR gate logic circuits $404_1$ to $404_N$. In this way, upon receipt of a done signal, each of the done signal registers $402_1$ to $402_N$ may continually retain and output a value indicating that a done signal has been received. This may be the case even if the done signal received at the first input transitions back down to a logic "low" level, as the logic "high" level of the output being fed back to the second input may determine the logic "high" output level of the output of the OR gate logic circuit.

Each of the done signal registers $402_1$ to $402_N$ may send respective output signals to an AND gate logic circuit 406, which may be configured to perform an AND logic operation to generate a done signal, denoted as $DONE_{ALL}$ in FIG. 4. When all of the done signal registers $402_1$ to $402_N$ send output signals with logic "high" levels to the AND gate logic circuit 406, the AND gate logic circuit 406 may be configured to generate the done signal at a logic "high" level, indicating that combiner module circuit 400 has received done signals from all of the gate modules $302_1$ to $302_N$. Alternatively, if less than all of the output signals received from the done signal registers $402_1$ to $402_N$ have a logic "high" level (i.e., at least one of the output signals has a logic "low" level), then the AND gate logic circuit 406 may generate and output the done signal with the logic "low" level, indicating that the combiner module circuit 400 has not received done signals from all of the gate modules $302_1$ to $302_N$.

The gate module circuit 400 may also be configured to communicate an output signal $DONE_{ALL\_C}$ to the external controller 308 that indicates which of the gate modules $302_1$ to $302_N$ have output done signals and/or when all of the gate modules $302_1$ to $302_N$ have output a done signal. The output signal $DONE_{ALL\_C}$ may be in the form of a multi-bit signal that includes bits corresponding to the gate modules $302_1$ to $302_N$, where each of the bits indicates whether or not the combiner module circuit 400 has received a done signal from a corresponding one of the gate modules $302_1$ to $302_N$.

As shown in FIG. 4, each of the done signal registers $402_1$ to $402_N$ may be configured to output respective output signals to a done signal concatenator circuit 408, which may be configured to generate the multi-bit output signal $DONE_{ALL\_C}$ based on the levels of the output signals received from the done signal registers $402_1$ to $402_N$. For some example configurations, if the number of N-number of gate modules $302_1$ to $302_N$ and done signal registers $402_1$ to $402_N$ is less than a number of bits of the multi-bit signal with which the done signal concatenator circuit 408 and the external controller 308 communicate, the done signal concatenator circuit 308 may be configured to append an appropriate number of zeros to the bits to generate the multi-bit output signal $DONE_{ALL\_C}$.

For some example configurations where the combiner module circuit 400 is configured to detect which of and/or when all of the gate modules $302_1$ to $302_N$ have output interrupt signals, the example combiner module circuit 400 may further include an N-number of interrupt signal registers $410_1$ to $410_N$ and a N-number of second OR gate logic circuits $412_1$ to $412_N$. Each of the interrupt signal registers $410_1$ to $410_N$ may have an input that is coupled to an output of one of the second OR gate logic circuits $412_1$ to $412_N$. Each of the interrupt signal registers $410_1$ to $410_N$ may be configured to receive, retain, and output the output received from a respective one of the second OR gate logic circuits $412_1$ to $412_N$.

Each of the second OR gate logic circuits $412_1$ to $412_N$ may have a first input that is configured to receive one of a N-number of interrupt signals—denoted as $INT_1$ to $INT_N$ in FIG. 4—from a respective one of the N-number of gate modules $302_1$ to $302_N$ shown in FIG. 3. Each of the second OR gate logic circuits $412_1$ to $412_N$ may also have a second input that is coupled to an output of a corresponding one of the interrupt signal registers $410_1$ to $410_N$.

Each of the second OR gate circuits $412_1$ to $412_N$ may be configured to generate an output signal by performing an OR logic operation on an interrupt signal received at a first input and an output of a corresponding one of the interrupt signal registers $410_1$ to $410_N$ received at a second input. An interrupt signal may be received at the first input when an input signal received at the first input transitions from a logic "low" level (i.e., a level corresponding to a logic "0") to a logic "high" level (i.e., a level corresponding to a logic "1"). Before an interrupt signal is received, each of the second OR gate logic circuits $412_1$ to $412_N$ may be configured to output an output signal having a logic "low" level indicating that the interrupt signal has not been received. In turn, the corresponding interrupt signal registers $410_1$ to $410_N$ may retain a logic "low" value and output an output signal with a corresponding logic "low" level indicating that the interrupt signal has not been received. The logic "low" output signal may be fed back to the second input of the corresponding one of the second OR gate logic circuits $412_1$ to $412_N$. In this way, before receipt of an interrupt signal, each of the interrupt signal registers $410_1$ to $410_N$ may continually retain and output a value indicating that an interrupt signal has not been received.

Upon receipt of an interrupt signal, each of the second OR gate logic circuits $412_1$ to $412_N$ may output the output signal at a logic "high" level indicating that the interrupt signal has been received. In turn, the corresponding interrupt signal registers $410_1$ to $410_N$ may retain a logic "high" value and output an output signal corresponding to the logic "high" level indicating that the done signal has been received. The logic "high" output signal may be fed back to the second input of the corresponding one of the second OR gate logic circuits $412_1$ to $412_N$. In this way, upon receipt of an interrupt signal, each of the interrupt signal registers $410_1$ to $410_N$ may continually retain and output a value indicating that an interrupt signal has been received. This may be the case even if the interrupt signal received at the first input transitions back down to a logic "low" level, as the logic "high" level of the output being fed back to the second input may determine the logic "high" output level of the output of the OR gate logic circuit.

The gate module circuit 400 may be configured to communicate an output signal $INT_{ALL\_C}$ to the external controller 308 (FIG. 3) that indicates which of the gate modules $302_1$ to $302_N$ have output interrupt signals and/or when all of the gate modules $302_1$ to $302_N$ have output an interrupt signal. The output signal $INT_{ALL\_C}$ may be in the form of a multi-bit signal that includes bits corresponding to the gate modules $302_1$ to $302_N$, where each of the bits indicates whether or not the combiner module circuit 400 has received an interrupt signal from a corresponding one of the gate modules $302_1$ to $302_N$.

As shown in FIG. 4, each of the interrupt signal registers $410_1$ to $410_N$ may be configured to output respective output signals to an interrupt signal concatenator circuit 414, which may be configured to generate the multi-bit output signal $INT_{ALL\_C}$ based on the levels of the output signals received from the interrupt signal registers $410_1$ to $410_N$. For some example configurations, if the N-number of gate modules $302_1$ to $302_N$ and interrupt signal registers $410_1$ to $410_N$ is less than a number of bits of the multi-bit signal with which the interrupt signal concatenator circuit 414 and the external controller 308 communicate, the interrupt signal concatenator circuit 414 may be configured to append an appropriate number of zeros to the bits to generate the multi-bit output signal $INT_{ALL\_C}$.

For some example configurations, the values that each of the done signal registers $402_1$ to $402_N$ may retain may each be a one-bit value having either a logic "high" level (i.e. a level corresponding to a logic "1") or a logic "low" level (i.e., a level corresponding to a logic "0") to indicate whether a respective done signal or interrupt signal has been received. FIG. 4 shows the N-number of done signal registers $402_1$ to $402_N$ and the N-number of interrupt registers $410_1$ to $410_N$ as separate registers. Alternatively, the group of done signal registers $402_1$ to $402_N$ and/or the group interrupt signal registers $410_1$ to $410_N$ may be combined as or collectively referred to as a multi-bit register, such as a N-bit register configured to store an N-number of bits. Additionally, for these configurations, the first OR gate logic circuits $404_1$ $404_N$ and/or the second OR gate logic circuits $412_1$ to $412_N$ may be configured to perform the logic OR operations in a bit-wise manner in order for the one-bit values to be stored in the done signal and interrupt signal registers $402_1$ to $402_N$, $410_1$ to $410_N$.

In addition, the done signal registers $402_1$ to $402_N$ and the interrupt signal registers $410_1$ to $410_N$ may be cleared of the values they are retaining in response to receipt of one or more clear register signals. For example, each of the done signal registers $402_1$ to $402_N$ may receive a clear done signal register signal, denoted as $CLEAR_{DONE}$ in FIG. 4, which may clear values being retained by the done signal registers $402_1$ to $402_N$. Similarly, each of the interrupt signal registers $410_1$ to $410_N$ may receive a clear interrupt signal registers signal, denoted as $CLEAR_{INT}$ in FIG. 4, which may clear values being retained by the interrupt signal registers $410_1$ to $410_N$. In addition or alternatively, each of the done signal registers $402_1$ to $402_N$ and the interrupt signal registers $410_1$ to $410_N$ may receive a clear all signal, denoted as $CLEAR_{ALL}$ in FIG. 4, which may clear values being retained by both the done signal registers $402_1$ to $402_N$ and the interrupt signal registers $410_1$ to $410_N$.

For some example configurations, the clear done signal register signal $CLEAR_{DONE}$ may be received after all of the done signal registers $402_1$ to $402_N$ have received done signals from all of the respective gate modules $302_1$ to $302_N$ so that the done signal registers $402_1$ to $402_N$ may be reset and ready to detect and communicate to the external controller 308 when a next set of done signals has been received from all of the gate modules $302_1$ to $302_N$. Similarly, the clear interrupt signal register signal $CLEAR_{INT}$ may be received after all of the interrupt signal registers $410_1$ to $410_N$ have received interrupt signals from all of the respective gate modules $302_1$ to $302_N$ so that the interrupt signal registers $410_1$ to $410_N$ may be reset and ready to detect and communicate to the external controller 308 when a next set of interrupt signals has been received from all of the gate modules $302_1$ to $302_N$. In addition or alternatively, the clear all signal $CLEAR_{ALL}$ may be received after all of the done signal registers $402_1$ to $402_N$ have received done signals and after all of the interrupt signal registers $410_1$ to $410_N$ have received interrupt signals.

Some or all of the clear done signal register signal $CLEAR_{DONE}$, the clear interrupt signal register signal $CLEAR_{INT}$, and the clear all signal $CLEAR_{ALL}$ signal may be received from external controller 308. For example, the external controller 308 may receive from the combiner module circuit 400 the multi-bit output signal $DONE_{ALL\_C}$ indicating that all of the done signals have been received, and in response, send the clear done signal register signal $CLEAR_{DONE}$ to the done signal registers $402_1$ to $402_N$. Similarly, the external controller 308 308 may receive from the gate module circuit 400 the multi-bit output signal $INT_{ALL\_C}$ indicating that all of the interrupt signals have been received, and in response, send the clear interrupt signal register signal $CLEAR_{INT}$ to the interrupt signal registers $410_1$ to $410_N$. Likewise, if the external controller 308 determines that the combiner module circuit 400 has received all of the done signals and all of the interrupt signals from the gate modules $302_1$ to $302_N$, such as upon receipt of either one or both of the multi-bit output signals $DONE_{ALL\_C}$ or $INT_{ALL\_C}$, then the external controller 308 may send the clear all signal $CLEAR_{ALL}$ to the done signal registers $402_1$ to $402_N$ and the interrupt signal registers $410_1$ to $410_N$.

Alternatively, some or all of the clear done signal register signal $CLEAR_{DONE}$, the clear interrupt signal register signal $CLEAR_{INT}$, and the clear all signal $CLEAR_{ALL}$ may be the done signal $DONE_{ALL}$ that is output from the AND gate logic circuit 406, since upon output of the done signal $DONE_{ALL}$, all of the done signal registers $402_1$ to $402_N$ will have received a done signal and all of the interrupt signal registers $402_1$ to $402_N$ will have received an interrupt signal.

Gate modules and combiner modules may be implemented in various ways other than those shown and described with reference to FIGS. 1 and 3. For example, as an alternative configuration to the system 300, less than an N-number of gate modules $302_1$ to $302_N$ may be used, such that at least one of the N-number of upstream devices $304_1$ to $304_N$ may send an output directly to the downstream device 306. In addition or alternatively, multiple combiner modules may be implemented. For example, a first combiner module may receive done signals from a first group of gate modules and a second combiner module may receive done signals from a second group of gate modules. In addition or alternatively, rather than receive done signals from gate modules, some or all of the done signals that are received may be output from another combiner module. Various configurations are possible.

Referring to FIGS. 1 and 3, the electronic devices in the example systems 100 and 300, including the electronic devices 104, 106, $304_1$ to $304_N$, and 306, may each be configured to perform one or more identified, discreet, and/or predetermined functions or operations. Example functions may include logic functions, Boolean functions, and/or arithmetic functions, as examples. In addition or alternatively, the functions may be associated with and/or related to sub-operations of an overall function, operation, purpose or objective of the electronic devices in the systems 100, 300. As an example illustration, the electronic devices in a system may be configured to perform address translation for memory applications, where the electronic devices may communicate data to each other in order to convert an input address (such as a logic address received from a host device) to an output address (such as a physical address where data is being stored). For this example application, the electronic devices may each be configured to perform a sub-operation of the overall address translation operation.

Additionally, the electronic devices may be positioned or configured in a pipeline, where the electronic devices communicate data in a single direction and each device in the pipeline has a designated function for an overall function of the pipeline. For example, one electronic device may receive data from an upstream device, process the data according to its designated function, and send the processed data to a downstream device, where that device processes the data according to its designated function, and outputs the data to another downstream device, and so on.

The data flow control modules, including the gate modules and/or the combiner modules, may be implemented into the pipeline in order to intervene in the data communication between the electronic devices if the external controller wants the data flow control modules to do so. For example, a gate module may be positioned in between two electronic devices in order to intercept the data being communicated and may alter the data being communicated to affect the flow of data being communicated through the pipeline. The external controller may be referred to as external because it is external to the pipeline and data being communicated through the pipeline is not communicated to the external controller unless the controller wishes to intervene.

For some example configurations, the electronic devices, along with the gate modules and/or the combiner modules, may be implemented in hardware, such as hardware logic, registers, multiplexers, flip-flops, or any other hardware circuits that does not access and/or execute software or firmware to perform its functions. In general, such hardware implementations may execute their respective functions faster than if a processor performed them by executing the software or firmware.

Figure 8:
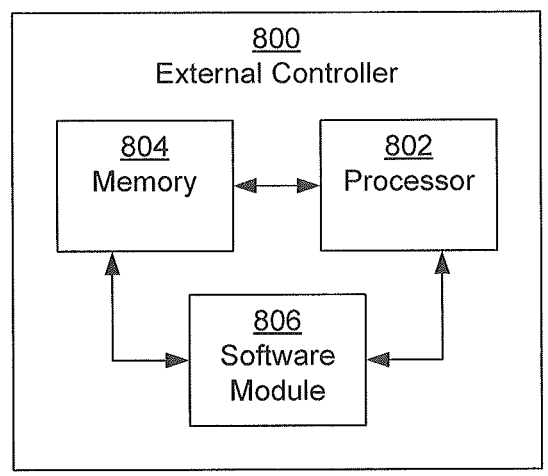
FIG. 8 is a block diagram of an example external controller.

In contrast, the external controllers 108, 308 may include a processor or processing device that performs its functions by executing software and/or firmware. Hereafter, the term software is used to refer to either software or firmware. FIG. 8 shows a block diagram of an example external controller 800, which may represent the external controllers 108, 308 shown and described with reference to FIGS. 1 and 3. The external controller 800 may include a processor 802 that is configured to perform the functions of the external controller 800. The processor 802 may include at least one general processor, digital signal processor, an application specific integrated circuit, a field programmable gate array, an analog circuit, a digital circuit, combinations thereof, or other now known or later developed processors. The processors may be configured together or separately, and together or separately, they may be a single device, a plurality of devices, or a combination of devices, such as associated with a network or distributed processing. Any of various processing strategies may be used, such as multi-processing, multi-tasking, parallel processing, remote processing, or the like. The processors may be responsive to and/or configured to execute instructions stored as part of software, hardware, integrated circuits, firmware, micro-code, or the like.

The processor 802 may be configured to communicate, access, and/or perform its functions using a memory 804. The memory 804 may be non-transitory computer readable storage media. The computer readable storage media may include various types of volatile and non-volatile storage media, including but not limited to random access memory, read-only memory, programmable read-only memory, electrically programmable read-only memory, electrically erasable read-only memory, flash memory, magnetic tape or disk, optical media, and the like. The memory 804 may be configured together or separately and/or and may be a single device or a combination of devices. The memory 804 may be adjacent to, part of, networked with and/or removable from the processor. Logic encoded in one or more non-transitory computer readable storage media for execution is defined as the instructions that are executable by the processor 802 and that are provided on the computer-readable storage media, memories, or a combination thereof.

The memory 804 may be a computer readable storage media having stored therein data representing instructions executable by the processor 802. The memory 804 may store instructions for the processor 802. The processor 802 may be programmed with and execute the instructions. The functions, acts, methods, or tasks illustrated in the figures or described herein may be performed by the processor 802 executing the instructions stored in the memory 306. The functions, acts, methods or tasks may be independent of the particular type of instructions set, storage media, processor or processing strategy and may be performed by software, hardware, integrated circuits, firmware, micro-code, and the like, operating alone or in combination. The instructions may be for implementing the processes, techniques, methods, or acts described herein.

The external controller 800 may also include a software module 806. The software module 806 may include software or firmware comprising a set of executable program instructions, which may be stored in the memory 804 and/or which the processor 802 may execute or use to perform one or more functions.

Figure 5:
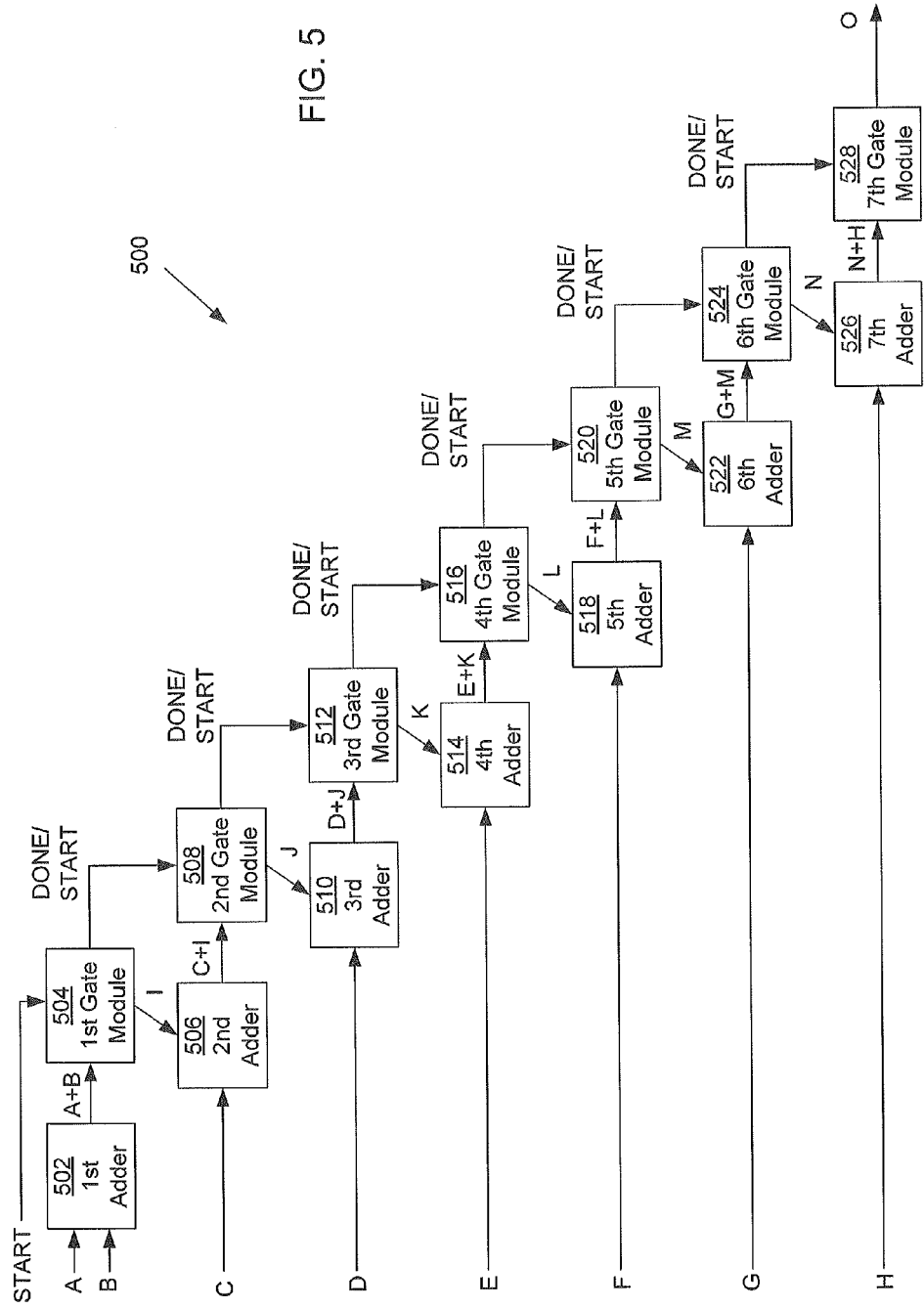
FIG. 5 is a block diagram of another example system that includes gate modules in a first example configuration for communication with a plurality of adder circuits.
Figure 6:
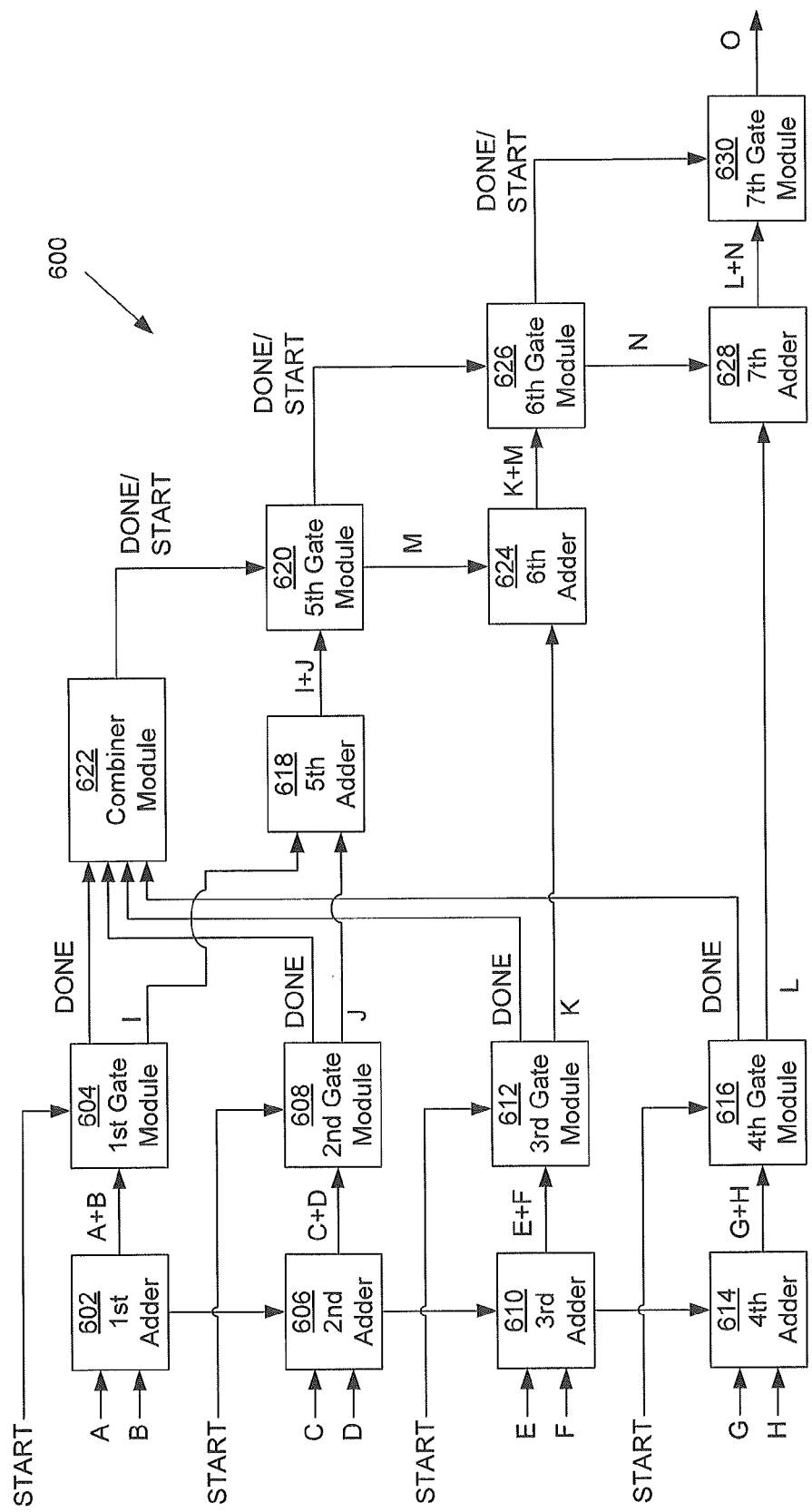
FIG. 6 is a block diagram of another example system that includes gate modules and a combiner module in a second example configuration for communication with a plurality of adder circuits.
Figure 7:
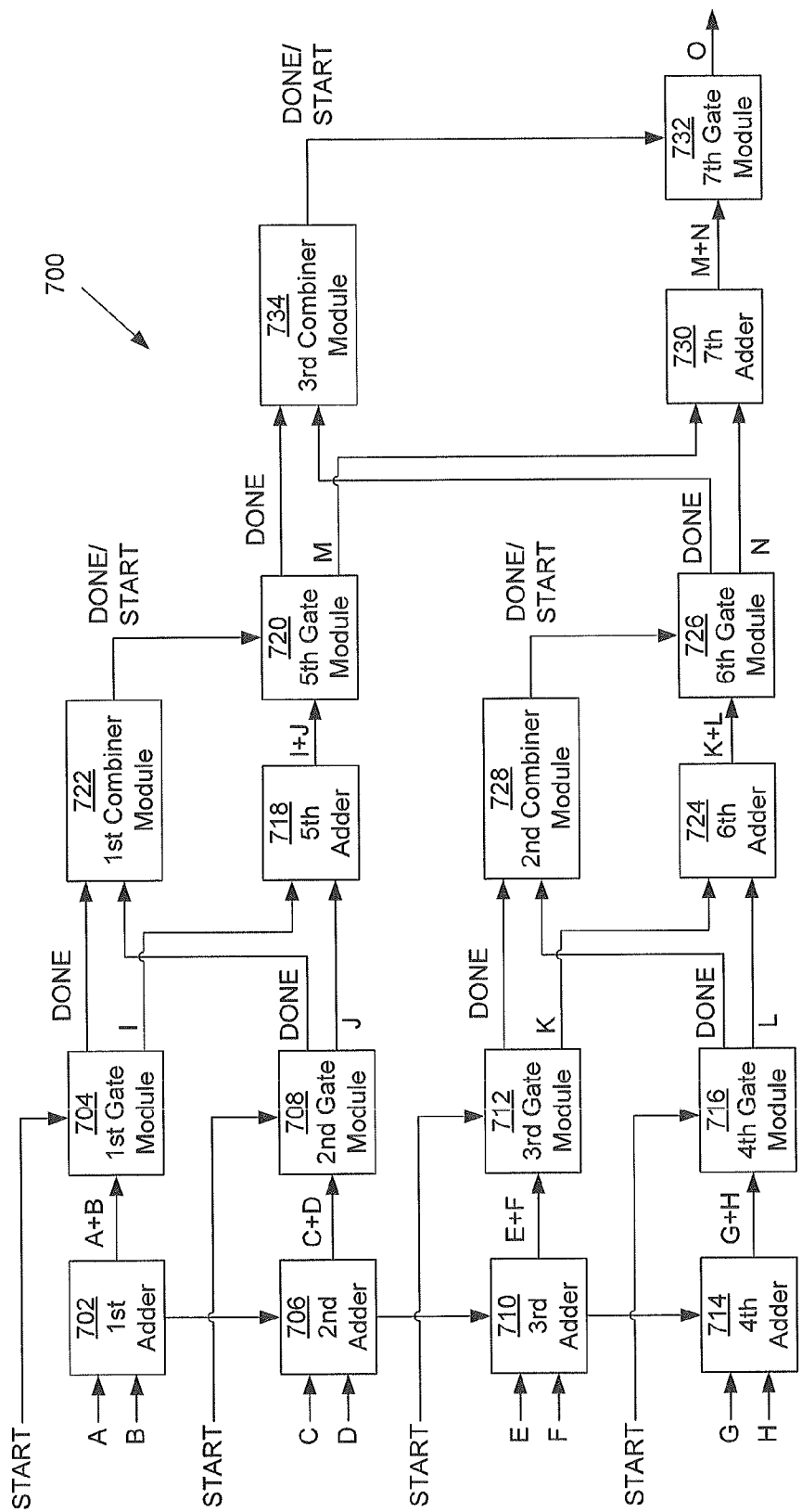
FIG. 7 is a block diagram of another example system that includes gate modules and combiner modules in a third example configuration for communication with a plurality of adders.

Referring to FIGS. 5-7, systems configured to perform the same overall function based on the same inputs may be implemented with different gate module and/or combiner module configurations. To illustrate, FIGS. 5, 6, and 7 show example systems 500, 600, and 700 each configured to add eight input values A, B, C, D, E, F, G, and H. The example system 500 shown in FIG. 5 is configured to first add input values A and B, then add that sum to input value C, then add that sum to input value D, then add that sum to input value E, and so on. The example system 600 shown in FIG. 6 is configured to concurrently add four pairs of inputs values— input values A and B, input values C and D, input values E and F, and input values G and H. Then, the sum of input values A and B is added to the sum of input values C and D, and that sum is added to the sum of input values E and F, and then that sum is added to the sum of input values G and H. The example system 700 shown in FIG. 7 is configured to concurrently add four pairs of inputs values—input values A and B, input values C and D, input values E and F, and input values G and H, like the system 600. Subsequently, the sum of input values A and B are added with the input values C and D, while the sum of input values E and F are added with the sum of input values G and H. The remaining two sums are then added together.

Without gate and combiner modules, the three systems 500, 600, and 700 are all configured to output the same value—the sum of the input values A, B, C, D, E, F, G, and H—but do so in different ways. In accordance with these differences, gate modules and combiner modules may be implemented in the three systems 500, 600, and 700 in different ways, as shown in FIGS. 5, 6, and 7. For simplicity purposes, external controllers communicating with the gate and combiner modules are omitted, although each of the gate and combiner modules may be configured to communicate with an external controller, in the same way as the gate and combiner modules communicate with an external controller as shown and described with reference to FIGS. 1 and 3. Additionally, each of the gate and combiner modules may be configured in accordance with the gate module circuit 200 and the combiner module circuit 400 shown in FIGS. 2 and 4.

In further detail, the system 500 may include a gate module coupled to an output of each adder and may not include any combiner modules. As shown in FIG. 5, the input values A and B may be input to a first adder 502, which may add the input values A and B and send a sum value (A+B) to a first gate module 504. The first gate module 504 may send an output value I to a second adder 506, which may add the output value I with the input value C and send a sum value (C+I) to a second gate module 508. The second gate module 508 may send an output value J to a third adder 510, which may add the output value J with the input value D and send a sum value (D+J) to a third gate module 512. The third gate module 512 may send an output value K to a fourth adder 514, which may add the output value K with the input value E and send a sum value (E+K) to a fourth gate module 516. The fourth gate module 516 may send an output value L to a fifth adder 518, which may add the output value L with the input value F and send a sum value (F+L) to a fifth gate module 520. The fifth gate module 520 may output an output value M to a sixth adder 522, which may add the output value M with the input value G and send a sum value (G+M) to a sixth gate module 524. The sixth gate module 524 may send an output value N to a seventh adder 526, which may add the output value N with the input value H and may send a sum value (N+H) to a seventh gate module 528. The seventh gate module 528 may output an output value O, which may be the data output of the system 500.

For the example system 500, the output values I, J, K, L, M, N, and O may be the same as or different from respective sum values (A+B), (C+I), (D+J), (E+K), (F+L), (G+M), and (N+H), depending on whether the associated first through seventh gate modules 504, 508, 512, 516, 520, 524, and 528 are configured in the pass mode or in the intervention mode and/or the values that an external controller (not shown in FIG. 5) instructs the gate modules 504, 508, 512, 516, 520, 524, and 528 to output.

Additionally, each of the gate modules 504, 508, 512, 516, 520, 524, 528 may configured to receive a start signal indicating to latch onto and/or when to latch onto data being received from an associated one of the adders 502, 506, 510, 514, 518, 522, 526. As shown in FIG. 5, the first gate module 504 may receive a start signal START as an external input to the system 500. In addition or alternatively, the start signal START may be communicated to the first gate module 504 from the external controller. The other gate modules may receive respective start signals from a directly upstream gate module. These start signals may done signals output by the directly upstream gate modules, as denoted by DONE/START in FIG. 5. Accordingly, the second gate module 508 may receive a DONE/START signal from the first gate module 504, the third gate module 512 may receive a DONE/START signal from the second gate module 508, and so on.

Referring to FIG. 6, a first adder 602 may be configured to add the input values A and B and send a sum value (A+B) to a first gate module 604. A second adder 606 may be configured to add the input values C and D and send a sum value (C+D) to a second gate module 608. A third adder 610 may be configured to add the input values E and F and send a sum value (E+F) to a third gate module 612. A fourth adder 614 may be configured to add the input values G and H and send a sum value (G+H) to a fourth gate module 614. As shown in FIG. 6, each of the first through fourth gate modules 604, 608, 612, 616 may receive a start signal, denoted as START in FIG. 6, as external inputs to the system 600 or as signals received from a device other than an upstream gate module or combiner module.

The first gate module 604 may send an output value I and the second gate module 608 may send an output value J to a fifth adder 618, which may add the output values I and J and send a sum value (I+J) to a fifth gate module 620. So that the fifth gate module 620 may not latch onto the sum value (I+J) until both the output value I and the output value J are values that an external controller (not shown) wants the first and second gate modules 604, 608 to output, respectively, the first gate module 604 and the second gate module 608 may each send done signals, as denoted by DONE in FIG. 6, to a combiner module 622. The combiner module 622 may send a done signal to the fifth gate module 620 when it receives done signals from both the first gate module 604 and the second gate module 608. Otherwise stated, the combiner module 622 may not output a done signal to the fifth gate module 620 if it has not received a done signal from both the first gate module 604 and the second gate module 608. The fifth gate module 620 may receive the done signal from the combiner module 622 as its start signal, as denoted by DONE/START in FIG. 6. In this way, the fifth gate module 620 may not latch onto the sum value (I+J) unless the output value I and the output value J are values that the external controller wants the first and second gate modules 604, 608 to output, respectively.

The third gate module 612 may send an output value K and the fifth gate module 620 may send an output value M to a sixth adder 624, which may add the output values K and M and send a sum value (K+M) to a sixth gate module 626. So that the sixth gate module 626 does not latch onto the sum value (K+M) until the output value M is a value that the external controller wants the fifth gate module 620 to output, the fifth gate module 620 may send a done signal to the sixth gate module 626, which the sixth gate module 626 may receive as its start signal, as denoted by DONE/START in FIG. 6.

In addition, so that the sixth gate module 626 does not latch onto the sum value (K+M) until the output value K is a value that the external controller wants the third gate module 612 to output, the fifth gate module 620 may not output the done signal to the sixth gate module 626 until the value K is a value that the external controller wants the third gate module 612 to output. So that this happens, the third gate module 612 may output a done signal to the combiner module 622. As such, the combiner module 622 may not output a done signal to the fifth gate module 620 unless the combiner module 622 has received a done signal from the third gate module 612. In turn, because the fifth gate module 620 may not output its done signal to the sixth gate module 626 until it receives a done signal from the combiner module 622, the fifth gate module 620 may not output its done signal to the sixth gate module 626 unless the third gate module 612 has output a done signal to the combiner module 622. As such, the sixth gate module 626 may not latch onto the sum value (K+M) until the third gate module 612 has output a done signal and the output value K is a value that the external controller wants the third gate module 612 to output.

The fourth gate module 626 may send an output value L and the sixth gate module 626 may send an output value N to a seventh adder 628, which may add the output values L and N and send a sum value (L+N) to a seventh gate module 630. So that the seventh gate module 630 does not latch onto the sum value (L+N) until the output value N is a value that the external controller wants the sixth gate module 626 to output, the sixth gate module 626 may send a done signal to the seventh gate module 630, which the seventh gate module 630 may receive as its start signal, as denoted by DONE/START in FIG. 6.

In addition, so that the seventh gate module 630 does not latch onto the sum value (L+N) until the output value L is a value that the external controller wants the fourth gate module 616 to output, the sixth gate module 626 may not output the done signal to the seventh gate module 630 until the output value L is a value that the external controller wants the fourth gate module 616 to output. So that this happens, the fourth gate module 616 may output a done signal to the combiner module 622. As such, the combiner module 622 may not output a done signal to the fifth gate module 620 unless the combiner module 622 has received a done signal from the fourth gate module 616. In turn, because the fifth gate module 620 may not output its done signal to the sixth gate module 626 until it receives a done signal from the combiner module 622, the fifth gate module 620 may not output its done signal to the sixth gate module 626 unless the fourth gate module 616 has output a done signal to the combiner module 622. As such, the seventh gate module 630 may not latch onto the sum value (L+N) until the fourth gate module 616 has output a done signal and the output value L is a value that the external controller wants the fourth gate module 616 to output.

The seventh gate module 630 may output an output value O, which may be the output value of the system 600. In accordance with the above, the output values I, J, K, L, M, N, and O may be the same as or different from the values that each of the first through seventh gate modules 604-630 respectively receives, depending on whether each of the first through seventh gate modules 604-630 are configured in the pass mode or in the intervention mode and/or the data that the external controller wants the first through seventh gate modules 604-630 to output.

Referring to FIG. 7, a first adder 702 may be configured to add the input values A and B and send a sum value (A+B) to a first gate module 704. A second adder 706 may be configured to add the input values C and D and send a sum value (C+D) to a second gate module 708. A third adder 710 may be configured to add the input values E and F and send a sum value (E+F) to a third gate module 712. A fourth adder 714 may be configured to add the input values G and H and send a sum value (G+H) to a fourth gate module 714. As shown in FIG. 7, each of the first through fourth gate modules 704, 708, 712, 716 may receive a start signal, denoted as START in FIG. 7, as external inputs to the system 700 or as signals received from a device other than an upstream gate module or combiner module.

The first gate module 704 may send an output value I and the second gate module 708 may send an output value J to a fifth adder 718, which may add the output values I and J and send a sum value (I+J) to a fifth gate module 720. So that the fifth gate module 720 may not latch onto the sum value (I+J) until both the output value I and the output value J are values that an external controller (not shown) wants the first and second gate modules 704, 708 to output, respectively, the first gate module 604 and the second gate module 608 may each send done signals, as denoted by DONE in FIG. 7, to a first combiner module 722. The first combiner module 722 may send a done signal to the fifth gate module 720 when it receives done signals from both the first gate module 704 and the second gate module 708. Otherwise stated, the first combiner module 722 may not output a done signal to the fifth gate module 720 if it has not received a done signal from both the first gate module 704 and the second gate module 708. The fifth gate module 720 may receive the done signal from the first combiner module 722 as its start signal, as denoted by DONE/START in FIG. 7. In this way, the fifth gate module 720 may not latch onto the sum value (I+J) unless the output value I and the output value J are values that the external controller wants the first and second gate modules 704, 708 to output, respectively.

Similarly, the third gate module 712 may send an output value K and the fourth gate module 716 may send an output value L to a sixth adder 724, which may add the output values K and L and send a sum value (K+L) to a sixth gate module 726. So that the sixth gate module 726 may not latch onto the sum value (K+L) until both the output value K and the output value K are values that the external controller wants the third and fourth gate modules 712, 716 to output, respectively, the third gate module 712 and the fourth gate module 716 may each send done signals, as denoted by DONE in FIG. 7, to a second combiner module 728. The second combiner module 728 may send a done signal to the sixth gate module 726 when it receives done signals from both the third gate module 712 and the fourth gate module 716. Otherwise stated, the second combiner module 728 may not output a done signal to the sixth gate module 726 if it has not received a done signal from both the third gate module 712 and the fourth gate module 716. The sixth gate module 726 may receive the done signal from the second combiner module 728 as its start signal, as denoted by DONE/START in FIG. 7. In this way, the sixth gate module 728 may not latch onto the sum value (K+L) unless the output value K and the output value L are values that the external controller wants the third and fourth gate modules 712, 716 to output, respectively.

In addition, the fifth gate module 720 may send an output value M and the sixth gate module 726 may send an output value N to a seventh adder 730, which may add the output values M and N and send a sum value (M+N) to a seventh gate module 732. So that the seventh gate module 732 may not latch onto the sum value (M+N) until both the output value M and the output value N are values that the external controller wants the fifth and sixth gate modules 720, 726 to output, respectively, the fifth gate module 720 and the fourth gate module 726 may each send done signals, as denoted by DONE in FIG. 7, to a third combiner module 734. The third combiner module 734 may send a done signal to the seventh gate module 732 when it receives done signals from both the fifth gate module 720 and the sixth gate module 726. Otherwise stated, the third combiner module 734 may not output a done signal to the seventh gate module 732 if it has not received a done signal from both the fifth gate module 720 and the sixth gate module 726. The seventh gate module 732 may receive the done signal from the third combiner module 734 as its start signal, as denoted by DONE/START in FIG. 7. In this way, the seventh gate module 732 may not latch onto the sum value (M+N) unless the output value M and the output value N are values that the external controller wants the fifth and sixth gate modules 720, 726 to output, respectively.

The seventh gate module 732 may output an output value O, which may be the output value of the system 700. In accordance with the above, the output values I, J, K, L, M, N, and O may be the same as or different from the values that each of the first through seventh gate modules 704-732 respectively receives, depending on whether each of the first through seventh gate modules 704-732 are configured in the pass mode or in the intervention mode and/or the data that the external controller wants the first through seventh gate modules 704-732 to output.

Other ways to implement gate modules and/or combiner modules in a system may be possible. For example, as an alternative to the example system 700, the fifth and sixth gate modules 720, 726 may not be included and instead, the fifth adder 718 and the sixth adder 724 may be configured to send their respective sum values (I+J) and (K+L) directly to the seventh adder 730. So that the seventh gate module 732 does not latch onto the sum of sum values (I+J) and (K+L) until the output values I, J, K, and L are all output values that the external controller wants output by the first through fourth gate modules 704-716, the first combiner module 722 and the second combiner module 728 may each send done signals to the third combiner 734. In turn, the third combiner module 734 may send its done signal to the seventh gate module 732 only after receipt of done signals from both the first combiner module 722 and the second combiner module 728.

Figure 9:
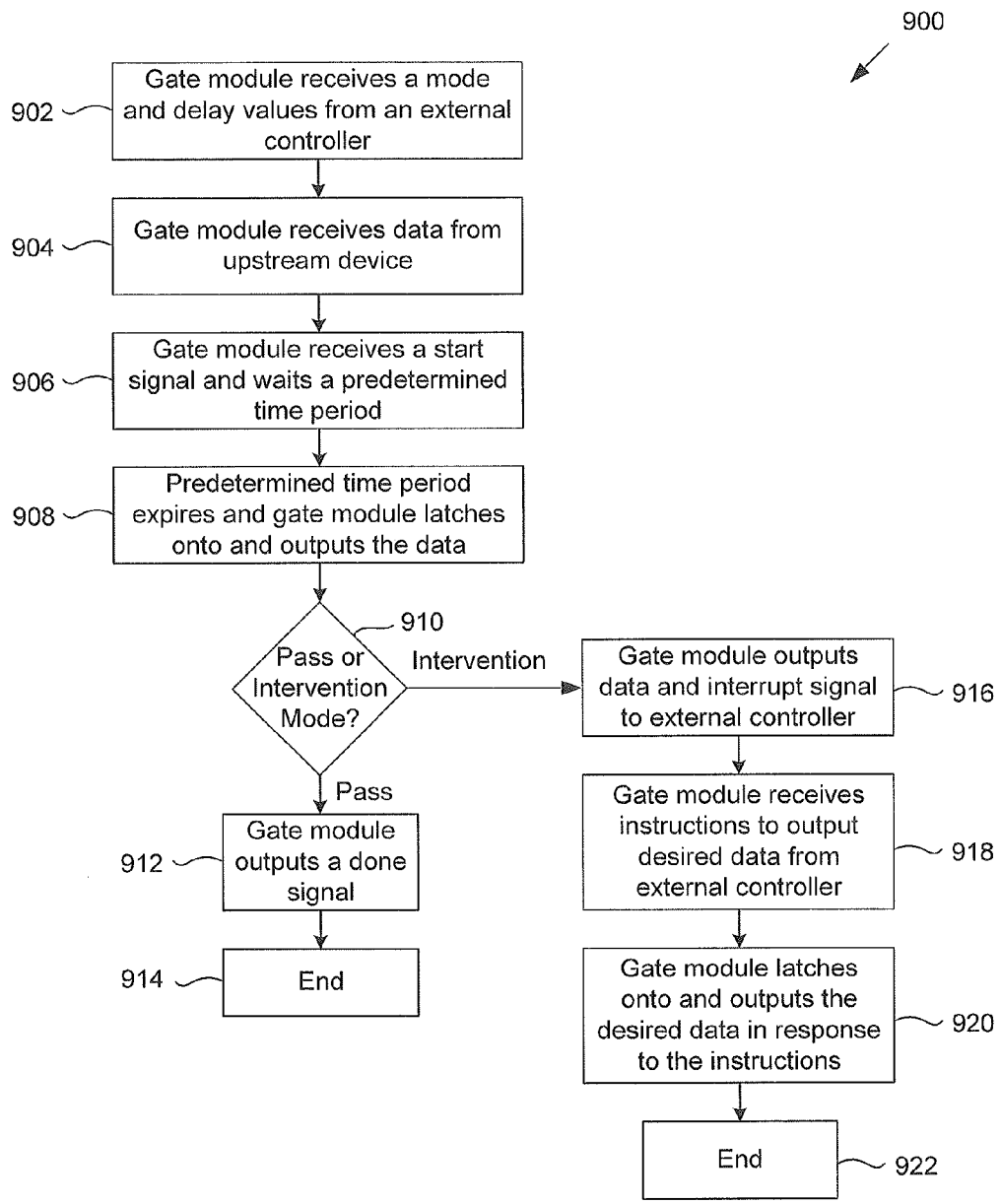
FIG. 9 is a flow chart of an example method of intervening in data communication with a gate module.

FIG. 9 shows a flow chart of an example method 900 of intervening in data communication with a gate module. At block 902, the gate module may receive from an external controller a mode value indicating whether the gate module is to be configured in the pass mode or in the intervention mode. In addition, at block 902, the gate module may receive from the external controller a delay value indicating an amount of time the gate module receiving the delay value is to wait before retaining data it is receiving.

At block 904, the gate module may receive data from an upstream device. At block 906, the gate module may receive a start signal. The start signal may be received from an upstream gate module, an upstream combiner module, or as an external input, such as from the external controller. In addition, at block 906, the gate module may start waiting the predetermined time period upon receiving the start signal. At block 908, the predetermined time period may expire, and the gate module may latch onto and output the data it is receiving from the first device to a downstream device. At block 910, if the gate module is configured in the pass mode, then the method may proceed to block 912, where the gate module may output a done signal to a downstream gate module or downstream combiner module, indicating that the gate module is, at least impliedly, outputting desired data as desired by the external controller. The done signal may be received by a downstream gate module, which may receive the done signal as its start signal. At block 914, the method may end.

Alternatively, at block 910, if the gate module is configured in the intervention mode, then at block 916, the gate module may output the data to the external controller. For some example methods, the gate module may first append one or more one-bit zero values to the data before sending the data to the external controller. In addition, at block 916, the gate module may send an interrupt signal to the external controller indicating that the gate module has latched onto the data. The interrupt signal may notify the external controller to begin analyzing the data received from the gate module.

At block 918, the gate module may receive from the external controller instructions to output desired data that the external controller wants the gate module to output. For some examples, the instruction may include the desired data. In addition, the instructions may instruct the gate module to latch onto the desired data received from the external controller. The instructions may also include an indication that the external controller is finished intervening. At block 920, in response to receipt of the instructions, the gate module may latch onto and/or output the desired data. Additionally, at block 920, the gate module may output a done signal to a downstream gate module indicating that the gate module is outputting desired data as desired by the external controller. The done signal may be received by the downstream gate module, which may receive the done signal as its start signal. At block 922, the method may end.

Figure 10:
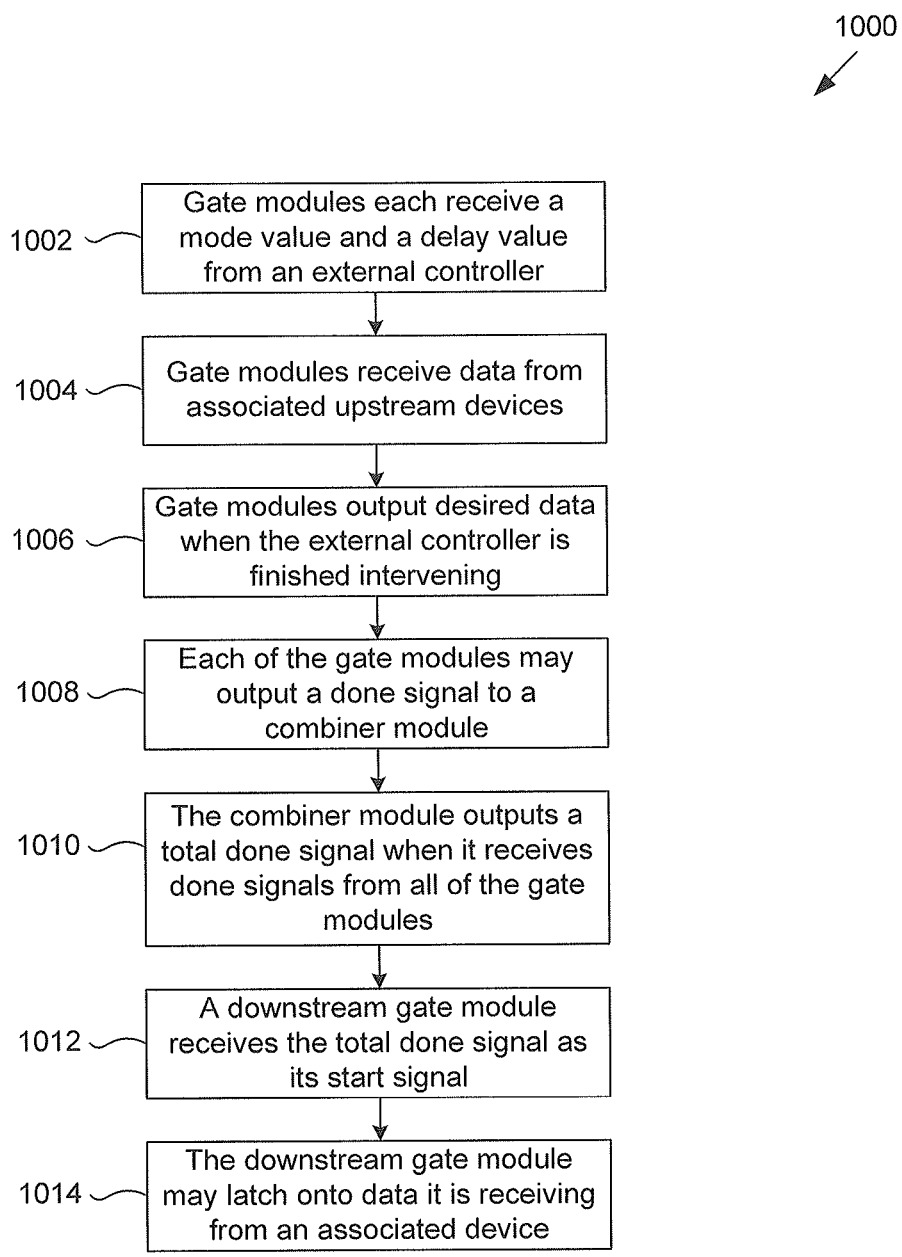
FIG. 10 is a flow chart of an example method of intervening in data communication with a plurality of gate modules and a combiner module.

FIG. 10 shows a flow chart of an example method 1000 of intervening in data communication with a plurality of gate modules and a combiner module. At block 1002 each of the plurality of gate modules may receive a mode value and a delay value from an external controller. At block 1004, each of the gate modules may receive data from an associated upstream device. At block 1006, each of the gate modules may output desired data to a downstream device when the external controller is finished intervening. For gate modules in the pass mode, the external controller may, by default, be finished intervening. For some examples, all of the gate modules may output respective desired data to the same downstream device. Alternatively, the respective desired data may be output to two or more different downstream devices. Each of the gate modules may output respective desired data at different times or at the same time, depending on when each receives a start signal, whether each is configured in the pass mode or in the intervention mode, when the external controller sends instructions to output the desired data for gate modules configured in the intervention mode, and/or the predetermined time periods with which each waits before outputting the data it receives from the associated upstream device.

At block 1008, each of the gate modules may output a respective done signal to the combiner module when outputting the desired data. At block 1010, the combiner module may detect that it has received a done signal from all of the plurality of gate modules, and in response, may output a total done signal to a downstream gate module. At block 1012, the downstream gate module may receive the total done signal as a start signal. At block 1014, the downstream gate module may latch onto data being received from an associated upstream device in response to receiving the total done signal as its start signal.

Figure 11:
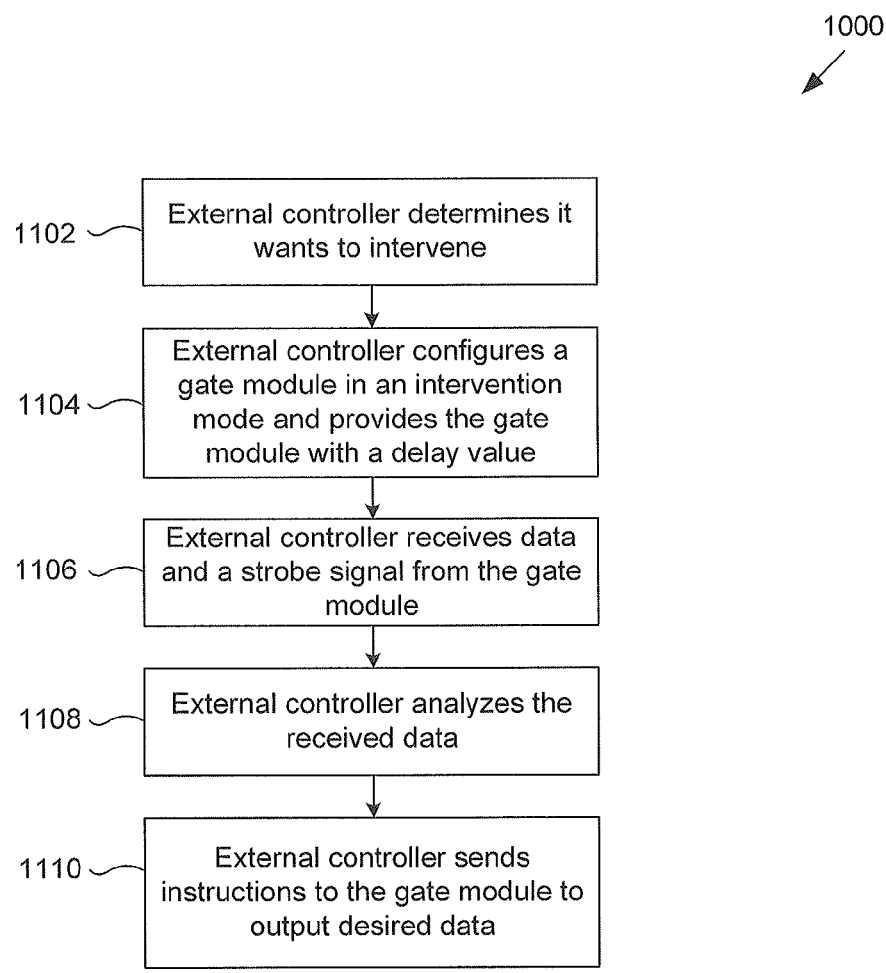
FIG. 11 is a flow chart of an example method of intervening in data communication with an external controller.

FIG. 11 shows a flow chart of an example method 1100 of intervening in data communication with an external controller. For some examples, the external controller may perform the example 1100 with a processor executing software. At block 1102, the external controller 1102 may determine that it wants to intervene in a data communication between a first device and a second device. At block 1104, in response to the determination at block 1102, the external controller may configure the gate module in an intervention mode. The external controller may do so by sending a mode value to the gate module indicating for the gate module to be configured in the intervention mode. The external controller may also send a mode strobe signal that instructs the gate module to retain, such as by latching onto, the mode value it is receiving. In addition, at block 1104, the external controller may send a delay value and a delay strobe signal that instructs the gate module to retain the delay value. For some examples, the external controller may send the delay value and the mode value at different times and/or send the delay value independent of its determination to intervene. For example, the external controller may send the delay value to the gate module at a first time, followed by a time period during which the gate module may be configured in the pass mode. Then, at a second time, the external controller may determine that it wants to intervene and send a mode value and a mode strobe signal that switches the mode of the gate module from the pass mode to the intervention mode.

At block 1106, the external controller may receive data that the gate module has received and latched onto from an upstream device. The external controller may also receive an interrupt signal from the gate module indicating that the gate module has latched onto the data. At block 1108, the external controller may analyze the data and determine desired data that the external controller wants the gate module to output. At block 1110, the external controller may send instructions to the gate module that instructs the external controller to output the desired data. The instructions may include one or more of the desired data, an instruction to latch onto the desired data, and an indication that the external controller is finished intervening.

It is intended that the foregoing detailed description be understood as an illustration of selected forms that the embodiments can take and does not intend to limit the claims that follow. Also, some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, any aspect of any of the preferred embodiments described herein can be used alone or in combination with one another. In sum, although the present invention has been described in considerable detail with reference to certain embodiments thereof, other versions are possible. Therefore, the spirit and scope of the appended claims should not be limited to the description of the embodiments contained herein.

I claim:

1. A system comprising:
a gate module circuit configurable in a pass mode and in an intervention mode,
wherein the gate module circuit is configured to:
receive data from a first device;
when configured in the pass mode, output the data received from the first device to a second device without output of desired data in response to receipt of an instruction from an external controller to output the desired data; and
when configured in the intervention mode:
send the data received from the first device to the external controller;
in response to sending the data to the external controller, receive the instruction from the external controller; and
output the desired data to the second device in response to receipt of the instruction.

2. The system of claim 1, wherein the gate module circuit is configured to output the data received from the first device in response to receipt of a start signal.

3. The system of claim 2, wherein the desired data comprises first desired data, wherein the system further comprises an upstream gate module circuit configured upstream to the gate module circuit, wherein the gate module circuit is configured to receive the start signal from the upstream gate module circuit, the start signal indicating that the upstream gate module is outputting second desired data as desired by the external controller.

4. The system of claim 3, wherein the upstream gate module circuit is configured to output the second desired data to the first device, and wherein the data that is received from the first device is based on the second desired data.

5. The system of claim 2, wherein the gate module circuit comprises a first gate module circuit, and wherein the system further comprises:
  a plurality of second gate module circuits, each configurable in the pass mode and in the intervention mode; and
  a combiner module circuit in communication with the plurality of second gate module circuits,
  wherein the plurality of second gate module circuits are configured to send a plurality of done signals to the combiner module circuit, each of the plurality of done signals indicating that a respective one of the plurality of second gate module circuits is outputting respective desired data as desired by the external controller,
  wherein the combiner module circuit is configured to output a total done signal upon receipt of all of the plurality of done signals from the plurality of second gate module circuits, and
  wherein the gate module circuit does not receive the start signal unless the combiner module circuit outputs the total done signal.

6. The system of claim 2, wherein the gate module circuit is further configured to:
  wait for a predetermined time period before outputting the data received from the first device, wherein the predetermined time period begins upon receipt of the start signal.

7. The system of claim 6, wherein the predetermined time period corresponds to a propagation delay of the first device.

8. The system of claim 1, wherein the gate module circuit is configured in either the pass mode or in the intervention mode in response to a mode value received from the external controller.

9. The system of claim 1, wherein the instruction comprises the desired data.

10. The system of claim 9, wherein the gate module circuit, when configured in the intervention mode, is further configured to:
  retain the desired data received from the external controller in response to receipt of a strobe signal from the external controller and when the mode value indicates for the gate module circuit to be configured in the intervention mode.

11. The system of claim 10, wherein the gate module circuit, when configured in the intervention mode, is further configured to:
  retain the data received from the first device; and
  send an interrupt signal to the external controller indicating that the gate module circuit has retained the data received from the first device,
  wherein the gate module circuit is configured to receive the desired data from the external controller after sending the interrupt signal to the external controller.

12. The system of claim 1, wherein the gate module circuit is further configured to output a done signal indicating that the gate module circuit is outputting the desired data, wherein:
  when the gate module circuit is configured in the pass mode, the gate module circuit is configured to output the done signal upon output of the data received from the first device, the desired data being the same as the data received from the first device; and
  when the gate module circuit is configured in the intervention mode, the gate module circuit is configured to output the done signal upon output of the desired data in response to the instruction received from the external controller.

13. The system of claim 12, wherein the data received from the first device comprises first data, and wherein the system further comprises:
  a downstream gate module circuit configured to:
    receive second data from a second device;
    receive the done signal output from the first gate module; and
    retain the second data received from the second device in response to receipt of the done signal.

14. A system comprising:
  an external controller; and
  a gate module circuit in communication with the external controller,
  wherein the external controller is configured to send a mode signal to the gate module circuit that configures the gate module circuit in one of a pass mode and an intervention mode,
  wherein the gate module circuit, in response to the mode signal, is configured in the one of the pass mode and the intervention mode, and
  when configured in the pass mode, the gate module circuit is configured to:
    output data received from a first device without output of a desired data in response to an instruction received from the external controller; and
  when configured in the intervention mode, the gate module circuit is configured to:
    send an interrupt signal to the external controller indicating that the gate module circuit has retained the data received from the first device;
    in response to sending the interrupt signal, receive the instruction from the external controller to output the desired data; and
    output the desired data to a second device in response to receipt of the instruction.

15. The system of claim 14, wherein the gate module circuit, when configured in the intervention mode, is further configured to:
  receive the desired data as the instruction or in addition to the instruction from the external controller in response to sending the interrupt signal to the external controller.

16. The system of claim 14, wherein the gate module circuit, when configured in the intervention mode, is further configured to:
  receive a strobe signal from the external controller indicating that the external controller is finished intervening in data communication between the first device and the second device; and
  in response to receipt of the strobe signal, output a done signal indicating that the gate module circuit is outputting the desired data.

17. The system of claim 14, wherein the gate module circuit is further configured to:
  receive a delay value from the external controller indicating a predetermined time period to wait before retaining the data received from the first device;

upon receipt of a start signal, begin waiting for the predetermined time period; and upon expiration of the predetermined time period, retain the data received from the first device.

18. A system comprising:

a pipeline comprising a first electronic device and a second electronic device;

an external controller configured to output a mode value indicating an intervention mode in response to a determination to intervene in the communication between the first electronic device and the second electronic device; and a gate module circuit configured between the first electronic device and the second electronic device in the pipeline, the gate module circuit configured to:

receive the mode value indicating the intervention mode from the external controller;

in response to receipt of the mode value indicating the intervention mode:

send data received from the first device to the external controller;

in response to sending the data to the external controller, receive an instruction from the external controller to output desired data as desired by the external controller; and output the desired data to the second device in response to receipt of the instruction.

19. The system of claim 18, wherein the gate module circuit is further configured to:

receive a start signal; and output the data received from the first device to the second device in response to receipt of the start signal.

20. The system of claim 19, wherein the desired data comprises first desired data, the instruction comprises a first instruction, and wherein the gate module circuit is configured to receive the start signal from an upstream gate module circuit, the start signal indicating that the upstream gate module is outputting second desired data in response to a second instruction received from the external controller.

21. The system of claim 19, wherein the gate module circuit comprises a first gate module circuit, and wherein the system further comprises:

a combiner module circuit configured to receive a plurality of done signals from a plurality of second gate module circuits, each of the plurality of done signals indicating that a respective one of the plurality of second gate module circuits is outputting respective desired data as desired by the external controller, and wherein the gate module circuit is configured to receive the start signal only when the combiner module circuit receives all of the plurality of done signals from the plurality of second gate module circuits.

22. The system of claim 19, wherein the gate module circuit is further configured to:

wait a predetermined time period before outputting the data received from the first device; and start the predetermined time period upon receiving the start signal.

23. The system of claim 18, wherein the gate module circuit, in response to the mode value indicating the intervention mode, is further configured to:

send an interrupt signal to the external controller indicating that the gate module circuit has retained the data received from the first device;

receive the desired data as the instruction or in addition to the instruction from the external controller after sending the interrupt signal;

receive a strobe signal from the external controller instructing the gate module circuit to retain the desired data received from the external controller; and retain the desired data received from the external controller in response to receiving the strobe signal.

24. The system of claim 18, wherein the data comprises first data, wherein the gate module circuit is further configured to:

output a done signal to a downstream gate module circuit indicating that the gate module circuit is outputting the desired data, and wherein the downstream gate module circuit is configured to retain second data received from the second device upon receiving the done signal from the first gate module circuit.

25. A system comprising:

a plurality of first gate module circuits, each of the plurality of first gate module circuits configured to output respective desired data as desired by an external controller;

an electronic device configured to generate output data in response to receipt of the respective desired data from each of the plurality of first gate module circuits;

a combiner circuit configured to:

receive a respective one of a plurality of done signals from each of the plurality of first gate module circuits, wherein each of the done signals indicates that a respective one of the plurality of first gate module circuits is outputting the respective desired data; and output a total done signal in response to receipt of all of the plurality of done signals from the plurality of first gate module circuits; and a second gate module circuit configured to latch on to the output data from the electronic device in response to receipt of the total done signal.

26. The system of claim 25, wherein the combiner circuit comprises:

a plurality of done signal registers, each done signal register configured to:

store a value indicating whether the combiner circuit has received a respective one of the plurality of done signals from one of the plurality of first gate module circuits; and output a respective one of a plurality of register output signals; and a plurality of OR gate logic circuits, each OR gate logic circuit comprising:

a first input configured to receive a respective one of the plurality of done signals;

a second input configured to receive one of the plurality of register output signals from a respective one of the plurality of done signal registers; and an output configured to provide an OR gate output signal to an input of the respective one of the plurality of done signal registers.

27. The system of claim 26, further comprising an AND gate logic circuit configured to:

receive the plurality of register output signals from the plurality of done signal registers; and output the total done signal according to an AND logic operation on the plurality of register output signals.

28. The system of claim 25, wherein the combiner circuit is further configured to:

receive a respective one of a plurality of interrupt signals from each of the plurality of first gate module circuits, each of the interrupt signals indicating that a respective one of the plurality of first gate module circuits has retained data from an upstream electronic device; and in response to receipt of all of the plurality of interrupt signals, output a total interrupt signal to the external controller, the total interrupt signal indicating to the external controller to begin analyzing data retained by the first gate module circuits.

29. The system of claim 28, wherein the combiner circuit comprises:

a plurality of interrupt signal registers, each interrupt signal register configured to:
  store a value indicating whether the combiner circuit has received a respective one of the plurality of interrupt signals from one of the plurality of first gate module circuits; and
  output a respective one of a plurality of register output signals; and a plurality of OR gate logic circuits, each OR gate logic circuit comprising:
  a first input configured to receive a respective one of the plurality of interrupt signals;
  a second input configured to receive one of the plurality of register output signals from a respective one of the plurality of interrupt signal registers; and
  an output configured to provide an OR gate output signal to an input of the respective one of the plurality of done signal registers.

30. The system of claim 29, further comprising an interrupt signal concatenator configured to:
  receive the plurality of register output signals from the plurality of interrupt signal registers; and
  output the total interrupt signal to the external controller.

31. The system of claim 25, wherein the electronic device is configured to perform a mathematical operation on the desired data from the plurality of first gate module circuits, the output data comprising a mathematical result of the mathematical operation, and
  wherein the second gate module circuit is configured to latch on to the mathematical result upon receipt of the total done signal.

* * * * *